(12) United States Patent
Popovich et al.

(10) Patent No.: US 9,654,134 B2
(45) Date of Patent: May 16, 2017

(54) HIGH DYNAMIC RANGE ANALOG-TO-DIGITAL CONVERSION WITH SELECTIVE REGRESSION BASED DATA REPAIR

(71) Applicant: Sound Devices LLC, Reedsburg, WI (US)

(72) Inventors: Steven Popovich, Little Chute, WI (US); Matt Anderson, Madison, WI (US)

(73) Assignee: Sound Devices LLC, Reedsburg, WI (US)

( * ) Notice: Subject to any disclaimer, the term of this patent is extended or adjusted under 35 U.S.C. 154(b) by 0 days.

(21) Appl. No.: 15/040,214

(22) Filed: Feb. 10, 2016

(65) Prior Publication Data

US 2016/0241252 A1 Aug. 18, 2016

Related U.S. Application Data

(60) Provisional application No. 62/116,770, filed on Feb. 16, 2015.

(51) Int. Cl.
| | |
|---|---|
| H03G 7/00 | (2006.01) |
| H03G 3/00 | (2006.01) |
| H04B 1/00 | (2006.01) |
| H03G 3/20 | (2006.01) |
| H03M 1/18 | (2006.01) |

(52) U.S. Cl.
CPC ................... H03M 1/188 (2013.01)

(58) Field of Classification Search
CPC .... H03M 1/12; G10L 19/025; G10L 19/0204; H03G 3/32
USPC ..................... 381/106, 57, 86, 104
See application file for complete search history.

(56) References Cited

U.S. PATENT DOCUMENTS

| | | | |
|---|---|---|---|
| 4,999,628 | A | 3/1991 | Kakubo et al. |
| 5,006,851 | A | 4/1991 | Kaneaki et al. |
| 5,250,948 | A | 10/1993 | Berstein et al. |
| 5,600,317 | A | 2/1997 | Knoth et al. |
| 5,684,480 | A | 11/1997 | Jansson |
| 5,714,956 | A | 2/1998 | Jahne et al. |
| 5,777,569 | A | 7/1998 | Naruki et al. |
| 6,028,946 | A | 2/2000 | Jahne |
| 6,031,478 | A | 2/2000 | Oberhammer et al. |

(Continued)

FOREIGN PATENT DOCUMENTS

WO 2013171500 11/2013

OTHER PUBLICATIONS

Report of the International Searching Authority, PCT/US16/17281, mailed Apr. 8, 2016.

(Continued)

*Primary Examiner* — Thjuan K Addy
(74) *Attorney, Agent, or Firm* — Andrus Intellectual Property Law, LLP

(57) ABSTRACT

A multi-stage analog-to-digital conversion method and system use window functions and translation to match high gain frames of data to target frames of data. The technique selects window data packets for the output stream based the stage of data having the highest gain satisfying selection criteria, such as requiring a frame of data for the respective stage to satisfy a predetermined accuracy of fit value compared to a target frame of data for a zero gain stage.

31 Claims, 9 Drawing Sheets

(56) References Cited

U.S. PATENT DOCUMENTS

| | | |
|---|---|---|
| 6,100,832 A | 8/2000 | Uesugi |
| 6,271,780 B1 | 8/2001 | Gong et al. |
| 6,317,065 B1 | 11/2001 | Raleigh et al. |
| 6,333,707 B1 | 12/2001 | Oberhammer et al. |
| 6,486,820 B1 | 11/2002 | Allworth et al. |
| 6,653,959 B1 | 11/2003 | Song |
| 6,683,552 B2 | 1/2004 | Noll et al. |
| 6,707,402 B1 | 3/2004 | Kern |
| 6,720,902 B2 | 4/2004 | Stimmann |
| 6,741,706 B1 * | 5/2004 | McGrath ............... H04S 3/004 381/22 |
| 6,965,658 B1 | 11/2005 | Lindqvist et al. |
| 7,003,126 B2 | 2/2006 | Killion et al. |
| 7,295,141 B1 | 11/2007 | Wu et al. |
| 7,365,664 B2 | 4/2008 | Caduff et al. |
| 7,656,327 B2 | 2/2010 | Filipovic et al. |
| 7,873,426 B2 | 1/2011 | Yamada |
| 7,911,368 B2 | 3/2011 | Thomas et al. |
| 7,924,189 B2 | 4/2011 | Sayers |
| 8,009,075 B2 | 8/2011 | Currivan et al. |
| 8,068,799 B1 | 11/2011 | Prestwich et al. |
| 8,130,126 B2 | 3/2012 | Breitschadel et al. |
| 8,217,822 B2 | 7/2012 | Lovitt |
| 8,462,029 B2 | 6/2013 | Ueno |
| 8,462,033 B2 | 6/2013 | Shabra et al. |
| 8,483,291 B2 | 7/2013 | Findlater et al. |
| 8,502,717 B2 | 8/2013 | Lin et al. |
| 8,508,393 B2 | 8/2013 | Ueno |
| 8,508,397 B2 | 8/2013 | Hisch |
| 8,606,381 B2 | 12/2013 | Zhang et al. |
| 8,878,708 B1 | 11/2014 | Sanders et al. |
| 8,964,998 B1 * | 2/2015 | McClain ............... H03G 3/32 381/106 |
| 2002/0188364 A1 | 12/2002 | Ota et al. |
| 2010/0088089 A1 | 4/2010 | Hardwick |
| 2011/0026739 A1 | 2/2011 | Thomsen et al. |
| 2011/0029109 A1 | 2/2011 | Thomsen et al. |
| 2011/0123031 A1 | 5/2011 | Ojala |
| 2012/0121106 A1 | 5/2012 | Henriksen |
| 2013/0103173 A1 | 4/2013 | Di Martino et al. |
| 2014/0104717 A1 | 4/2014 | Zhang et al. |
| 2014/0176238 A1 | 6/2014 | Guo et al. |

OTHER PUBLICATIONS

PCT Search Report and Written Opinion in pending application PCT/US16/17281.

* cited by examiner

100B Two stage version

HIGH DYNAMIC RANGE ANALOG-TO-DIGITAL CONVERSION WITH SELECTIVE REGRESSION BASED DATA REPAIR

BACKGROUND

Analog-to-digital conversion is commonly used in a wide variety of applications, where one or more analog signals are converted to digital format via an analog-to-digital converter (or ADC) at a fixed sample-rate for recording, transmission, filtering, enhancement or further processing. Generally speaking, a higher resolution or increased number of significant bits in the conversion is desirable for improved dynamic range to reduce the chances of clipping, while at the same time, minimizing quantization noise. In many applications such as digital audio recording, several ADC's may be used simultaneously. In some applications, the presence of a high resolution ADC may eliminate or reduce the need for limiters that would otherwise introduce distortion.

SUMMARY

The disclosed invention provides an improvement over existing methods of combining multiple stages of analog-to-digital conversion in order to render an ADC device providing a dynamic range approaching (e.g, 28 bits) or 168 dB. The invention allows for the elimination of limiters in audio recording, while at the same time, preserves high fidelity digitization/conversion of sound (with a sufficient number of bits), even when approaching very low levels (lower limit of human hearing).

The invention addresses the fact that even a slight offset in frequency-dependent or time-dependent timing alignment, linear relationship or offset of data from one ADC to the next can constitute a relatively large number of least-significant bits. In order to utilize high-gain data on a highly adaptive and time-dependent manner, the invention employs rapid and reliable tracking for gains, offsets or other parameters defining relationships between ADC stages, with the ability to continually recalculate and assess these relationships on a frame-by-frame basis. The disclosed digital processing methods and algorithms effectively track gains, offsets and other parameters defining the relationship between ADC stages and also address other issues that prior art approaches do not adequately address.

Even for up to several 10's to 100's of milliseconds after the termination of a clipping event in a high-gain stage, low-frequency dissimilarities resulting in distortion may remain due to transient response or recovery artifacts in the high-gain analog stage or the ADC itself, whereas higher frequency details may become valid within this time frame. Further, differences in analog processing and filtering at the front-end of the system may vary slightly from stage to stage. The significance of these differences may depend on the frequency content of the input signal and vary with time. An example waveform from an audio recorder, is shown in FIG. 8 and illustrates a case where low-frequency distortion is present on a high-gain ADC for an extended period of time after severe clipping. With the present invention, it may still be possible to utilize ADC information from the high-gain stage in some portions of the signal.

One aspect of the invention pertains to a digital processing method that applies window functions to preferably overlapping time spans (or frames) of digital output signals created by at least two parallel ADC's contained in input stages having different analog input gains. The windowed data sections are referred to as "window-packets". Before applying the window functions, data from a first stage ADC is processed or translated on a frame-by-frame basis to be aligned with data from the other ADC's present in the system. Typically, the first stage is the lowest gain stage or an unamplified stage. Translating can take different forms, but in accordance with one exemplary embodiment of the invention, translating is accomplished by adding a DC offset, adjusting the slope and/or applying one or more gains with or without the application of delay for a frame of data in order to match the translated frame to one or more target frames of data derived from one or more of the other ADC outputs, preferably derived from ADC outputs having the lowest analog gain. An accuracy of fit parameter (e.g., $\epsilon_{12}$) derived from the difference between the matched frames is desirably used to determine which frames or window-packets to select in creating the output. Additional ways of constructing the output stream based on selected window packets are described below in the Detailed Description.

In accordance with this aspect of the invention, windowing functions are repeatedly applied to output frames from two or more ADC's having different analog input gains. A function is then applied to align (or translate) data frames from one ADC output to closely match those from another ADC output prior to conversion of these to window-packets. A selector is used to choose which window-packets supplied to a combiner are subsequently combined to provide a high-dynamic range digital output.

In an exemplary embodiment of the invention, a least-squares fit is performed between window-packets or preferably between frames when calculating DC offset, rotation or gain coefficients with or without delay, and an accuracy of fit parameter (e.g., $\epsilon_{12}$) may be generated based on the sum of squares in the difference between translated frames or window-packets (after one is fitted to the other). The accuracy of fit parameter (e.g. $\epsilon_{12}$) is used in this embodiment to select which window-packet to include in the output.

In contrast, prior art methods based on testing the magnitude of the ADC output data against a threshold or clipping cannot be reliably used for these data sections or for reliably detecting mismatch due to nonlinearities, noise or transfer function dissimilarities between stages, including phase shift or delay.

A further advantage of this invention is the ability to utilize data from multiple stages of analog-to-digital conversion and provide a transition between frames of data based on independent coefficient and parameter estimation from one frame to the next to make possible rapid, reliable and selective repair (or de-noising) for sections of output data.

Those skilled in the art should appreciate that the invention is not only useful for audio applications but also useful in other applications in which analog-to-digital conversion is used. For example, the invention may be used when sensing vibration, or digitizing electrical signals such as for oscilloscopes, for controls in automotive or robotic applications, or for scientific instruments (temperature, pressure, light intensity).

DETAILED DESCRIPTION

Figure 1:
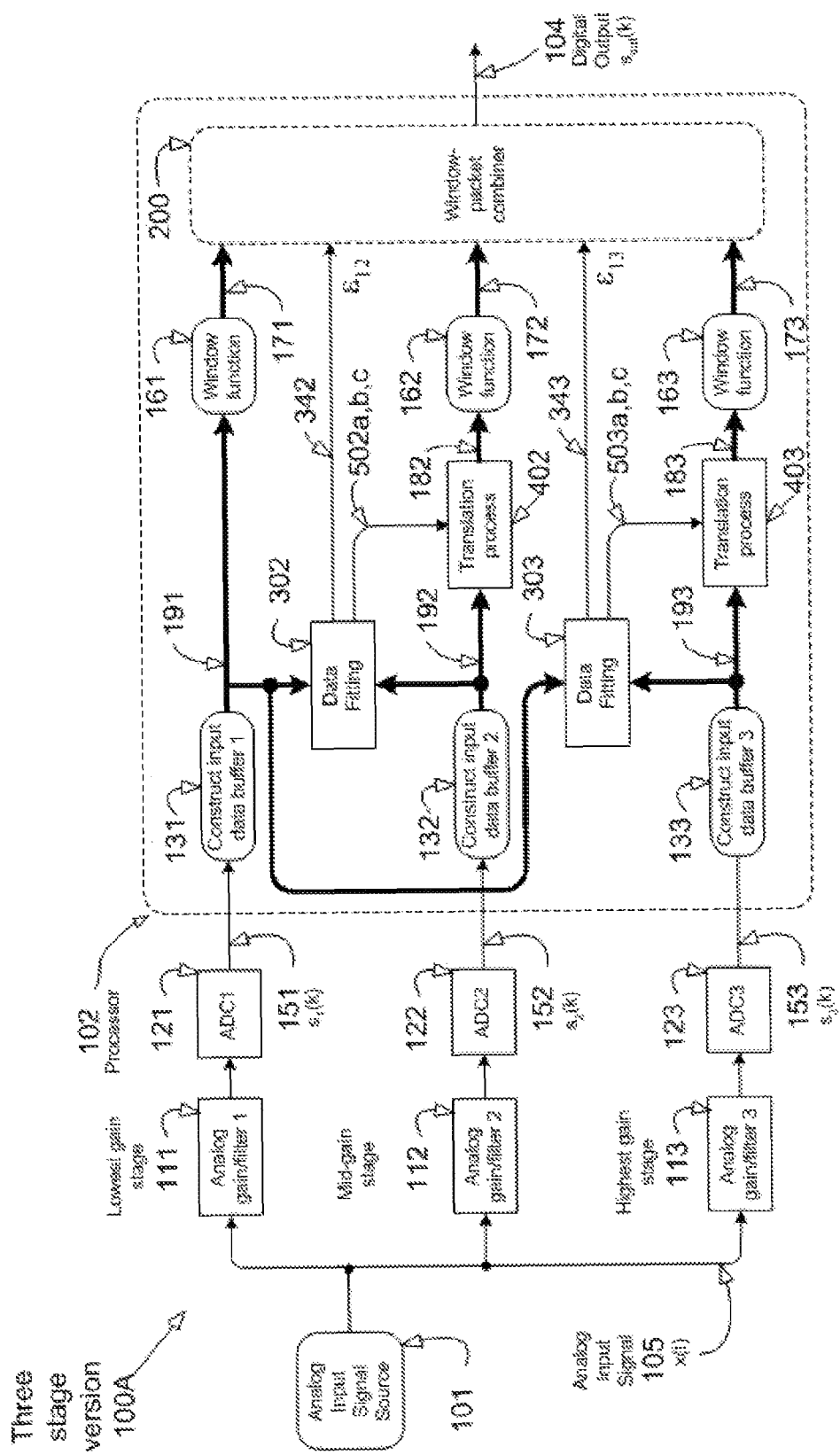
FIG. 1 is a simplified block diagram of a three-stage version of an array based high dynamic-range ADC in accordance with a first exemplary embodiment of the present invention.

FIG. 1 shows a system 100A constructed in accordance with an exemplary embodiment of the invention for performing array based high dynamic-range, analog-to-digital conversion. It should be noted that bold lines in FIG. 1 depict sections of the system 100A where it is most convenient to transfer data on the basis of buffers (or collections of data samples that may also be referred to as vectors or frames). Although FIG. 1 illustrates an example having three analog-to-digital converters (ADC's) or stages, the system 100A can theoretically be extended to an arbitrary number of stages. The variable $N_S$ is used herein to represent the number of stages in the system 100A. So in the case of FIG. 1, $N_S$=3.

As shown in FIG. 1, an analog input signal source 101 supplies an analog input x(t) 105 to three parallel analog circuits 111, 112 and 113. The analog input signal source 101 may be a microphone or a wireless microphone with an amplified output or another type of audio transducer such as a guitar pickup, geophone, sonar receiver, accelerometer or ultrasonic receiver. Each analog circuit 111, 112 and 113 may internally incorporate a signal conditioner, an anti-aliasing filter and/or a unique gain. Preferably, the analog filter and gain for each succeeding stage is set to a larger amplification than for the preceding stage. Additional dissimilarities in the transfer functions associated with these components may include differences in phase response. Accordingly, in the exemplary system 100A in FIG. 1, the second stage analog circuit 112 has a gain larger than the gain for analog circuit 111 of the first stage. Furthermore, the analog circuit 113 of the third stage provides the highest level of analog amplification, being higher than the level of amplification for the analog circuit of the second stage 112. Along these lines, the analog circuit 111 providing the lowest gain level may even attenuate the analog signal 105, x(t). While a difference in gain of 24 dB between stages may be preferred in many systems, there are no restrictions (including no need for 6 dB steps) in the present invention as to the precise differences or similarities in gains between each stage. The filtered output from each analog circuit 111, 112 and 113 is applied as input to a corresponding ADC 121, 122 and 123, respectively, such that each generates a corresponding digital input signal 151, 152 and 153, $s_i(k)$, $s_2(k)$, $s_3(k)$. The digital inputs created by each ADC 151, 152 and 153 are then applied as inputs to a digital processor 102 that digitally combines them to create a high resolution digital output $s_{out}(k)$ 104. The digital processor 102 may be a microprocessor or digital signal processor (for example, an Analog Devices Blackfin ADSP-535 DSP, Texas Instruments C67xx DSP or an ARM processor) containing or having access to software instructions for creating the digital output $s_{out}(k)$ 104. Alternatively, the digital processing may be FPGA based or utilize an ASIC. The processor 102 can reside, e.g., in a mixer, recorder or wireless microphone. In some embodiments, the digital output signal 104 may be recorded or provided for live listening or playback. In other embodiments, the digital output signal $s_{out}(k)$ 104 is provided as the digital input signal for a mixer or digital microphone output. In mixing applications or other applications such as multi-channel (i.e., multi-track) recording, more than a single channel (or instance) of analog-to-digital conversion may be desired. In these cases, each channel may independently achieve high resolution analog-to-digital conversion by applying the invention to each channel. In some applications, the high resolution analog-to-digital conversion criteria applied to each channel may be identical. In other applications, the degree of accuracy provided may vary from channel to channel, where some channels will provide higher resolution conversion or have a different number of stages contained within them than for other channels. For example, one channel may use a two stage version, while another in the same device may be assigned a three stage version. Alternatively, in a devices having two channels where each has two stages, the analog gain for one may be 24 dB, while for another it may be 30 dB, since each ADC itself may differ. In some applications, the accuracy for each channel may also indeed be identical (two stage for all of them). In some embodiments, the digital processor 102 of FIG. 1 combines digital inputs 151, 152 and/or 153 in a live (or real-time) capacity where digital output data 104 is continuously generated as the incoming analog signal 105 is received. In other embodiments, the digital processor 102 may be applied to data from the digital inputs 151, 152 and/or 153 that have been previously recorded or otherwise stored (post-production) to generate a digital output 104 at a later time.

Within the digital processor 102, the ADC output data 151, 152 and 153 is collected in buffering functions 131, 132 and 133 for constructing or forming input data buffers (or vectors or frames of data) 191, 192 and 193 respectively. For example, referring to the first stage, the digital input signal 151 $s_1(k)$ created by the ADC1 121 is accumulated over a number $N_w$ of samples and these are collectively provided as an input data buffer 191. The preferred number of samples collected for each buffer may be sample-rate dependent and range from a fraction of a millisecond (0.5 ms) to several milliseconds (10 ms) of data. As an example, if the sample-rate is set to 192 kHz, and the buffer length is set to 2 ms, $N_w$=384 samples of data would be collected to fill an input data buffer. As another example again referring to the first stage, the digital input signal 151 $s_1(k)$ may be continuously supplied as the input through a delay-line holding $N_w$=384 samples, where the contents of the delay line is periodically referenced (once each frame) as representing a filled input data buffer. Throughout this disclosure, bold letters in equations refer to either matrices or vectors (or buffers), while non-bold variables refer to scalar (single dimension) entities. Furthermore, the discrete time index k refers to the most recent sample-period, while frame index q refers to the most recent frame (or buffer of data). Note that data referred to by a given frame preferably overlaps data from adjacent frames, so frames will be collected at a rate at least equal to and preferably faster than every $N_w$ sample periods. Using vector notation, we may express the output of the $j^{th}$ stage input data buffer completed at discrete-time index k (counting up by one for each sample collected during each sample period from the ADC's 151, 152, 153s), as $$s_{kj}=[s_j(k)s_j(k-1)s_j(k-2)\ldots s_j(k-(N_w-1))]^T \quad (1)$$

where $N_w$, refers to the size (or length) of the buffer (or vector or frame) and $s_j(k)$ (noting this non-bold symbol representing a scalar data sample, rather than buffer) refers to the digital input signal created by the respective ADC 151, 152, 153 for the $j^{th}$ stage at discrete time index k. Note this data buffer spans $N_w$ samples of data. For example, at time index k, $s_1(k)$ refers to the output of the first stage ADC1 121 and at time k and an ordered collection of the $N_w$ most recent samples from ADC1 121 comprises $s_{k1}$, which refers to the input data buffer (or vector or frame) 191 from the first (j=1) stage that is output from the first stage buffering function 131. Upon the completion for each frame (at which time, frame index q increments by one), buffering functions 131, 132 and 133 provide additional (or updated) input data buffers 191, 192 and 193.

As shown, input data buffers 191 and 192 (or vectors $s_{k1}$ and $s_{k2}$) output from the first and second respective buffering function 131 and 132 are fed as inputs to the buffer data fitting function 302 that performs the task of modeling relationships between those inputs. Furthermore, input data buffers 191 and 193 (or vectors $s_{k1}$ and $s_{k3}$) output from the respective first buffering function 131 and third buffering function 133 are fed as inputs to the buffer data fitting function 303 that includes modeling relationships between those inputs. Translation coefficients 502a, 502b and 502c derived from the first buffer data fitting function 302 are applied to translating buffers of data 192 supplied by the second buffering function 132 at operation 402, producing a second stage translated buffer 182. Translation coefficients 503a, 503b and 503c derived from the second data fitting function 303 are applied to translating buffers of data 193 supplied by the third buffering function 133 at operation 403, producing a third stage translated buffer 183. The input data buffer 191 is directly supplied as the input to windowing function 161 for creating the window-packet buffer 171. In contrast, the second stage translated buffer 182 and third stage translated buffer 183 are then be supplied as inputs to windowing functions, 162 and 163 respectively to create window-packet buffers 172 and 173 respectively. All three resultant window-packets 171, 172 and 173 are then supplied to a window-packet combiner 200 for generating the digital output stream 104. Accuracy of fit parameters $\epsilon_{12}$ 342 and $\epsilon_{13}$ 343 derived from the data fitting functions 302 and 303 respectively are also applied to the window-packet combiner 200.

Figure 2:
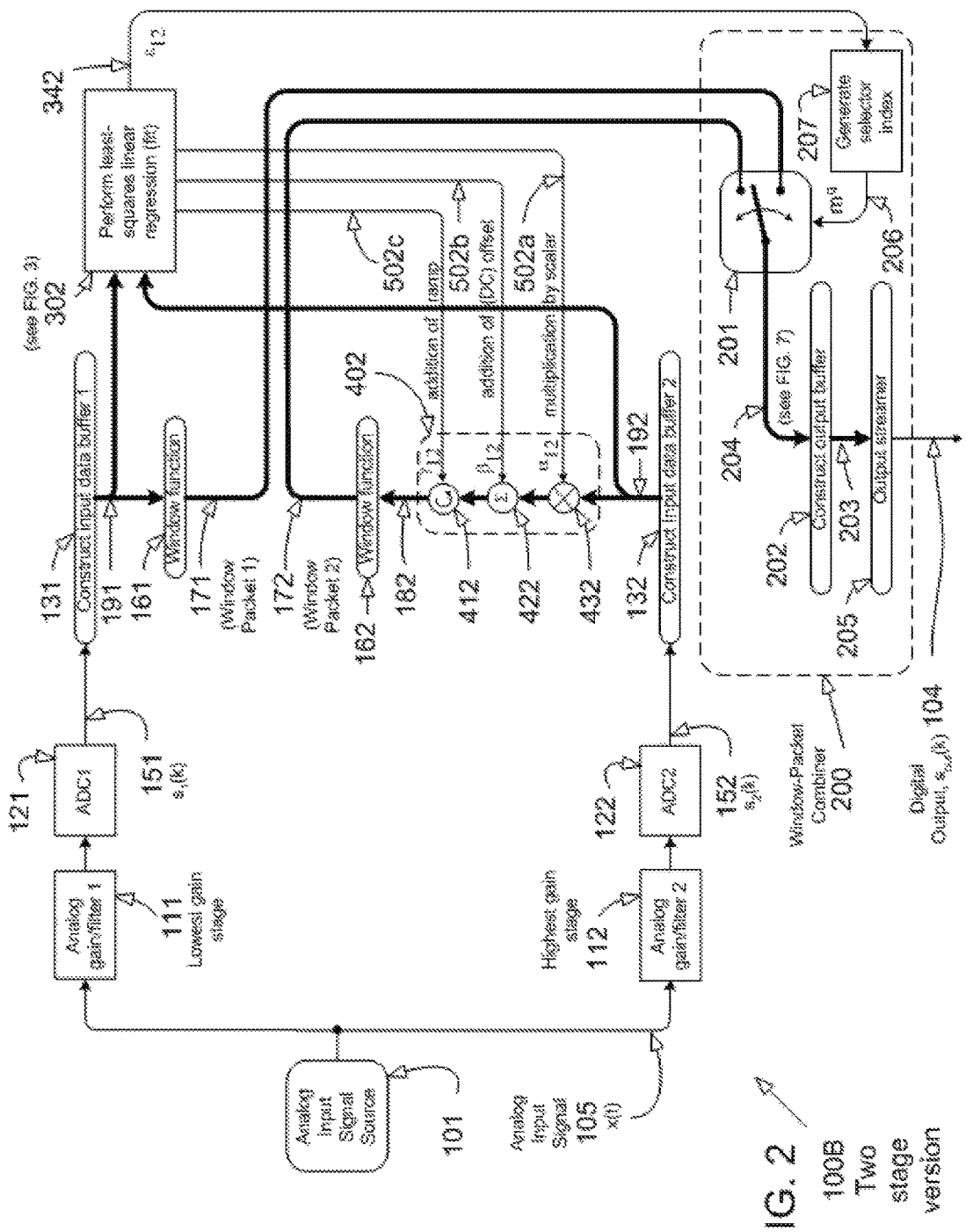
FIG. 2 is a simplified block diagram of a two stage version of an array based high dynamic-range ADC that includes additional details relating to window translation and selection in accordance with another exemplary embodiment of the present invention.

FIG. 2 provides another exemplary embodiment of an array based high dynamic range analog-to-digital conversion system 100B according to the invention. Here, the operations are essentially similar to those described in FIG. 1, except only two stages are used ($N_S$=2) in this example.

FIG. 2, however, illustrates additional details regarding operation of the system. Comparing FIG. 1 with FIG. 2, we can see that the system 100A or 100B need not be construed to any fixed number of stages. It should further be observed that the two stage version for system 100B in FIG. 2 may be derived from the three stage version for system 100A in FIG. 1 by the deletion of elements 113, 123, 133, 153, 193, 303, 403, 183, 163, 173, 503a, 503b and 503c, along with changing the window-packet combiner 200 from a 3 input version to a two input version. For the sake of clarity, like reference numbers are used for objects that are in common between the three stage example of FIG. 1 and the two stage example of FIG. 2. FIG. 2 also provides additional details involving the operation of translation process 402 and window-packet combiner 200. It should again be noted that the notation of FIG. 2 again provides bold lines to signify transmission of buffers (or vectors or frames) of data.

In contrasting the operation of the first and second stages, the second stage buffering function 132 preferably internally operates analogously to the first stage buffering function 131. Furthermore, window function 162 preferably internally operates similarly to window function 161. However, the translation process 402 present in the second stage between the output 192 of the second stage buffering function 132 and window function 162 contrasts the fact that no translation process is shown in the first stage between the output 191 of the first stage buffering function 131 and window function 161. Although in alternative embodiments one could be present, the exemplary embodiment described in FIG. 2 does not require one. In general, when more than two or an arbitrary number of stages are present, a data fitting operation along with a companion translation process may be present for each succeeding stage where the data fitting process fits data output from its corresponding buffering function to the output 191 of the first stage buffering function 131.

Alternatively, other topologies for data fitting are envisioned in the scope of this disclosure. For example, the highest ordered stage may apply data fitting for its input data buffer to that for the preceding stage. Subsequently, data fitting may be applied for the result to data from the input data buffer from the stage before that. Subsequent data fitting of each result to data from the input buffer of each preceding stage may continue until data fitting is performed to data from the input buffer of the first (or lowest gain) stage. For example, the system 100A of FIG. 1 could be reconfigured such that data from the third stage is fitted to data from the second stage and subsequently, the resultant data is fitted to data from the first stage. Original data from the second stage could also be fitted to data from the first stage in the event data from the third stage (referring to the highest gain stage) is corrupt. The selector 201 in window-packet combiner 200 may then continue to operate in selecting packets corresponding to the highest gain stage whose data is not corrupted.

The translation process 402 includes the operation of scaling 432 (or multiplying) the input data buffer 192 by a scalar $\alpha_{12}$ 502a supplied by the data fitting function 302. The translation block may further include the operation of adding a DC offset 422 using an offset coefficient $\beta_{12}$ 502b. Finally, it may include an optional operation 412 for adding a ramp function using a slope coefficient $\gamma_{12}$ 502c. Following these operations, the result is output as a translated buffer 182 (or translated frame of data) to be fed as an input to the window function 162 to produce the window-packet 172. This window-packet 172 is supplied in combination with the window-packet from the first stage 171 to the window-packet combiner 200 along with an accuracy of fit parameter 342, $\epsilon_{12}$, derived from the data fitting function 302. Inside the window-packet combiner 200, a selector 201 selects window-packets where the decision as to which window-packet 171 or 172 to use is based on a window-packet selector index $m^q$ 206 (where m refers to the index for which window packet to select and q refers to the frame index) that is supplied by the selector index generator 207. The selector index generator 207 preferably uses the accuracy of fit parameter $\epsilon_{12}$ 342 calculated by the data fitting function 342 during each frame for making decisions for the desired setting of window-packet selector index $m^q$ 206. The window-packet 204 selected by the selector 201 is supplied to an output construction process or a function 202 for adding in overlapping window-packets sequentially received from one frame to the next in constructing output buffers (or collections of one or more data values or vectors) 203. Subsequently, an output streamer (or streaming unit) 205 may retrieve individual sequential samples for creating the output stream 104, $s_{out}(k)$, from the data contained in constructed output buffers 203.

Although the window-packet selector 201 is shown to select between two inputs, in general, this selector may have a total of $N_S$ inputs (for example, $N_S=3$ inputs for the three-stage system 100A of FIG. 1). Furthermore, the selector index generator 207 is shown to receive one accuracy of fit parameter $\epsilon_{12}$ 342. In general for the preferred embodiments of the invention, it may receive a total of $N_S-1$ coefficients (for example, it may receive two coefficients $\epsilon_{12}$ and $\epsilon_{13}$ during each frame when $N_S=3$)

Turning to the operation of the $j^{th}$ stage translation process (for example if j=2, referring to translation process 402), using matrix notation, we may express an ($N_w \times N_c$) regression matrix, where $N_c$ denotes the number of ($N_w \times 1$) columns contained in it. For example, by setting $N_c=3$ a regression matrix for the $j^{th}$ stage may be constructed as $$X_j = [s_{kj} b r] \quad (2)$$

In Eq. 2, $s_{kj}$ is defined by Eq. 1 selecting data from the $j^{th}$ stage, b represents an ($N_w \times 1$) column vector where each element is set to a constant value (such as a vector of ones) for modeling DC offset and r represents an ($N_w \times 1$) column vector of ramp values for modeling slope such as a vector where the first element is set to zero and subsequent values count based on their index multiplied by a constant step (such as $$\frac{1}{N_w - 1})$$

to a predetermined value (such as unity). For example, r may be set according to $$r = \begin{bmatrix} 0 & \frac{1}{(N_w - 1)} & \frac{2}{(N_w - 1)} & \cdots & 1 \end{bmatrix}^T \quad (3)$$

Alternatively, other values for the constant step may be used. Note the subscript k is omited from the expression $X_j$ in the left part of Eq. 2 for simplicity. It should be understood that the definition of $X_j$ may be considered as flexible with regard to how many elements (or columns) are included in it. As will be described later, $X_j$ may include the three vectors, as shows in Eq. 2 or some of these terms may be omitted and/or others added. Generally, for fitting data from the $j^{th}$ stage to the first stage, the following auto-correlation matrix $R_j$ and cross-correlation matrix $p_{j1}$ may be defined $$R = X_j^T X_j \quad (4)$$

$$p_{j1} = X_j^T s_{k1} \quad (5)$$

From which the solution for the coefficients (or coefficient vector) that provides the least-squares fit when aligning (or translating) combinations of data from the regression matrix for the $j^{th}$ stage to most closely match (that is, minimizing the sum of squared errors over the span of the buffers) data from the reference input data buffer (first stage) becomes $$c_{1j} = R_j^{-1} p_{j1} \quad (6)$$

It should be understood that the dimension of $c_{1j}$ in Eq. 6 is in general ($N_c \times 1$) and this is dependent on the dimension ($N_c \times N_c$) for $R_j$ from Eq. 4 that in turn depends on the dimension ($N_w \times N_c$) for $X_j$, with Eq. 2 being a ($N_w \times 3$) example. An ($N_w \times 1$) vector of data that has been fitted to the input data buffer 191 from the first stage and is based on data contained in the input data buffer from the $j^{th}$ stage along with a DC constant and ramp vector as inputs is computed using the equation, $$\hat{s}_{k1j} = c_{1j}^T X_j \quad (7)$$

Vector $\hat{s}_{k1j}$ may be equivalently written in expanded form as:

$$\hat{s}_{k1j} = [\hat{s}_{1j}(k) \hat{s}_{1j}(k-1) \hat{s}_{1j}(k-2) \ldots \hat{s}_{1j}(k-(N_w-1))]^T \quad (8)$$

The "hat" symbol over the vector $\hat{s}_{k1j}$ and each of its elements indicates that these refer to data that has resulted from translating (or fitting) data from one input data buffer to match the first stage data buffer 191 as close as possible in minimizing the sum of squared errors between them. In cases where the combination of gain, slope and DC offset are modeled as is the case when $X_j$ is set according to Eq. 2, the computed weight vector $c_{1j}$ for the $j^{th}$ stage may be partitioned into three ($N_c=3$) coefficients, $$c_{1j} = \begin{bmatrix} \alpha_{1j} \\ \beta_{1j} \\ \gamma_{1j} \end{bmatrix} \quad (9)$$

For example, in the case of the system 100B of FIG. 2 using j=2 for the second stage, $\alpha_{12}$ is a scale coefficient 502a that depends on the ratio between the amplitude for data present in the second stage input data buffer 192 and first stage input data buffer 191. A DC offset coefficient $\beta_{12}$ 502b depends on the difference between the zero-frequency DC offset terms present in the second input data buffer 192 compared to the first stage input data buffer 191. Finally, an optional slope coefficient $\gamma_{12}$ 502c depends on the difference in the slope of data present the second input data buffer 192 compared to the first stage input data buffer 191.

Continuing with the case where data from the second stage is fitted to data from the first stage (see FIG. 2), using the following equations derived from Eq. 2 through Eq. 7 with j=2, the $N_w \times 1$) column vector of values from the higher-gain second stage ADC2 contained in $s_{2k}$ 192 may be scaled, offset and rotated to create a new vector of data, $\hat{s}_{k12}$ 182. This result serves as a set of de-noised values for the corresponding ($N_w \times 1$) vector of values from ADC1, $s_{1k}$. In a similar manner when three stages are used as in FIG. 1, $\hat{s}_{k13}$ 183 may be computed based on Eq. 2 through Eq. 7 with j=3 for fitting data from input data buffer 193 from the third stage to match data contained in input data buffer 191 from the first stage. It is important to recognize, that even after a buffer of data is translated with respect to gain, DC offset and slope, other important and high resolution informational content is left intact and retained in the translated buffer of data. The function of Eq. 7 may be thought of as performing the operations shown in block 402 of FIG. 2. Alternatively, these operations may be carried out sequentially, as indicated by operations 412, 422 and 432 in FIG. 2.

Figure 3:
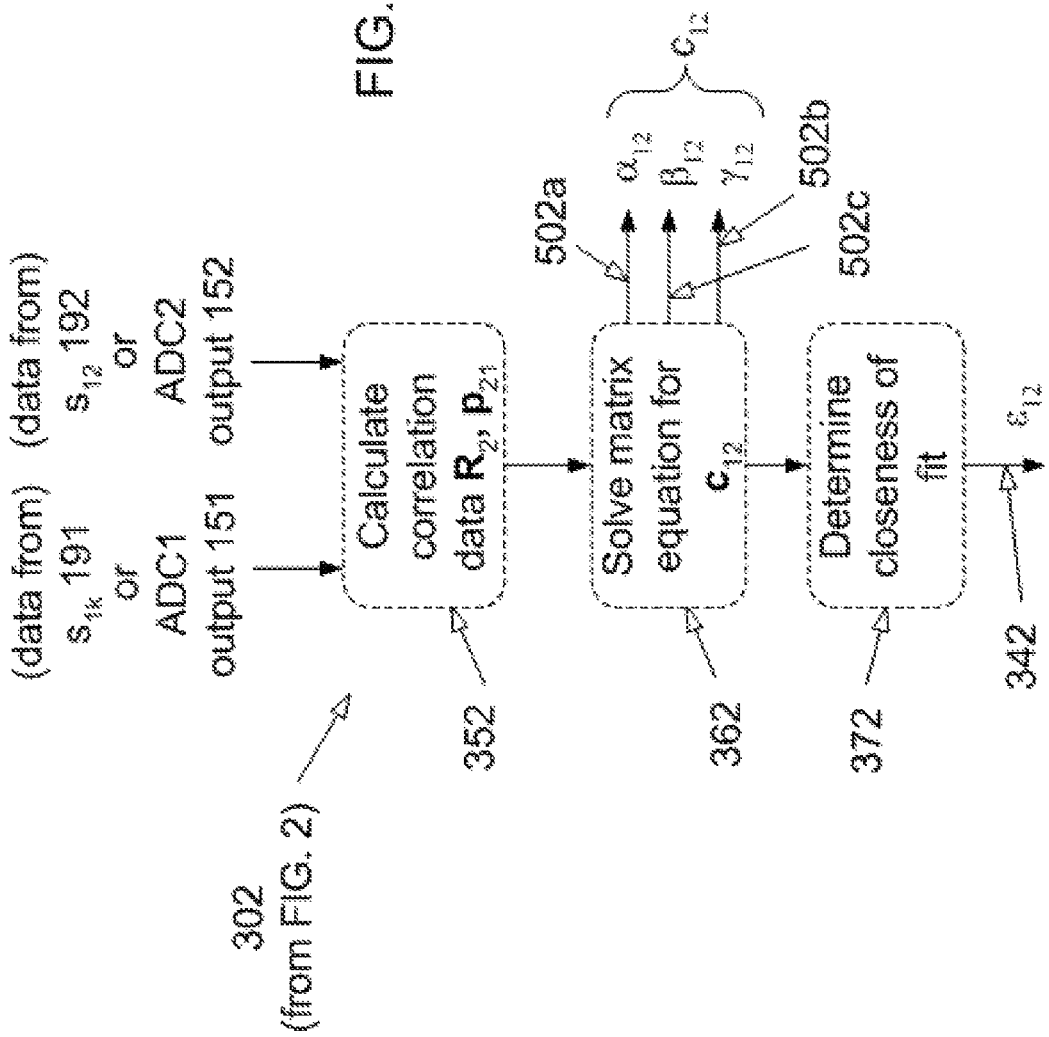
FIG. 3 is a flowchart showing process steps for coefficient and parameter estimation according to an exemplary embodiment of the invention.

FIG. 3 provides a flowchart illustrating steps by way of example that may be taken in the data fitting process 302 (from either FIG. 1 or FIG. 2). At operation 352, a buffer of input signal data 191 from the first stage may be combined with a buffer of input signal data 192 from second stage and collectively used in computing a (3×3) data correlation matrix according to the following equation (where since this fitting process is applied to the second stage, j=2).

$$R_2 = X_2^T X_2 \quad (10)$$

and furthermore, a (3×1) cross-correlation vector may be determined according to $$p_{21} = X_2^T s_{k1} \quad (11)$$

Operation 362 may apply Eq. 6 (again, to the second stage for this simplified case) and may be rewritten as $$c_{12} = R_2^{-1} p_{21} \quad (12)$$

The translated buffer 182 may then be computed at operation 402 (see FIGS. 1 and 2) using $$\hat{s}_{k12} = c_{12}^T X_2 \quad (13)$$

As another example, in cases where ($N_c$=2), only gain and DC offset may be adjusted (where slope adjustment is omitted) and furthermore, if only two stages are used ($N_S$=2), the ($N_w$×2) regression matrix comparable to Eq. 2 simplifies to $$X_2 = [s_{k2} b] \quad (14)$$

Using this, the resulting dimension for the data correlation matrix of Eq. 10 becomes (2×2) with a (2×1) cross-correlation vector resulting from Eq. 11. Applying these in Eq. 12 results in a (2×1) coefficient vector for fitting data from the second stage to the first stage that may be expressed as $$c_{12} = \begin{bmatrix} \alpha_{12} \\ \beta_{12} \end{bmatrix} \quad (15)$$

Relating this back to FIG. 3, Eq. 12 yields the output of operation 362, but with slope adjustment coefficient 502c $\gamma_{12}$ removed.

Generally, the result for each coefficient determined according to this method will be interdependent on the results for other coefficients and which ones are included. For example, the values for coefficients $\alpha_{12}$ 502a and $\beta_{12}$ 502b taken from Eq. 15 (computed based on the regression input matrix of Eq. 14 with only gain and DC offset), will in general be different than those same coefficients taken from Eq. 9 (where values for all three: $\alpha_{12}$ 502a and $\beta_{12}$ 502b and $\gamma_{12}$ 502c are computed based on the input regression matrix of Eq. 2 applied to the second stage, j=2). This occurs since all coefficients in $c_{12}$ (or in general, $c_{1j}$) are optimally computed on an interdependent basis for the best least squares fit between the supplied buffers.

In cases where translation is desired between two different stages and neither is the first stage, the techniques provided may be easily modified to apply the same techniques between those stages. In other words, if translation of an input data buffer from the $j^{th}$ stage is intended to match that for the $i^{th}$ stage (where j≠1 and i≠1), the equations previously described, may be applied with the substitution of index i for index 1 in each equation and matrix construction and reference to/from data from the $i^{th}$ stage rather than the first stage. This may be useful in embodiments where for example, data from a third stage 193 is translated to match data from a second stage 192 and then subsequently, the resultant data is translated to match data from a first stage 192, rather than matching data from a third stage directly to that from a first stage. For example, in general $\hat{s}_{kij}$ refers to data that has resulted from translating (or fitting) data from the $j^{th}$ stage input data buffer to match the $i^{th}$ stage data buffer as close as possible in minimizing the sum of squared errors between them where $$c_{ij} = R_j^{-1} p_{ji} \quad (16)$$

$$\hat{s}_{kij} = c_{ij}^T X_j \quad (17)$$

and $$p_{ji} = X_j^T s_{ki} \quad (18)$$

In constructing $X_j$ data from an input buffer may be used as previously described, or alternatively, it may be constructed from data that has already been translated. For example, if resultant data from the third stage 193 that has already been translated to align it with data from the second stage buffer 192 (producing $\hat{s}_{k23}$) is to be again translated to match the first stage input buffer 192, $X_2$ could be constructed according to $$X_2 = [\hat{s}_{k23} b r] \quad (19)$$

and Equations 16 through 18 would be applied with the setting j=2 and i=1.

In some alternative embodiments, data provided at the output of corresponding ADC's (in the two stage case of FIG. 2, ADC1 output $s_1(k)$ 151 and ADC2 output $s_2(k)$ 152) may in general be accumulated at operation 352 on a sample-by-sample rather than buffer-by-buffer basis into both $R_j$ and $p_j$ to reduce the intermittency of the data processing load (e.g. cycle load in a DSP). For example, we may express Eq. 4 and Eq. 5 in an alternative form for construction by accumulation on a sample-by-sample basis.

$$R_j = \begin{bmatrix} R_{j(11)} & R_{j(12)} & R_{j(13)} \\ R_{j(21)} & R_{j(22)} & R_{j(23)} \\ R_{j(31)} & R_{j(32)} & R_{j(33)} \end{bmatrix} = \sum_{p=0}^{N_w-1} \begin{bmatrix} s_j(k-p) \\ 1 \\ \frac{p}{(N_w-1)} \end{bmatrix} \begin{bmatrix} s_j(k-p) & 1 & \frac{p}{(N_w-1)} \end{bmatrix} \quad (20)$$

and $$p_{j1} = \begin{bmatrix} p_{j1(1)} \\ p_{j1(2)} \\ p_{j1(3)} \end{bmatrix} = \sum_{p=0}^{N_w-1} \begin{bmatrix} s_j(k-p) \\ 1 \\ \frac{p}{(N_w-1)} \end{bmatrix} s_1(k-p) \quad (21)$$

These equations may be implemented by initializing $R_j$ and $p_{j1}$ to zero at the beginning of a frame (except for terms in $R_j$ that purely depend on constants such as $R_{j(22)}$, $R_{j(23)}$, $R_{j(32)}$ and $R_{j(33)}$ may be pre-computed). Then for each subsequent sample period throughout the frame, one of the $N_w$ terms during each sample period during which a new sample is received from each respective ADC is accumulated. In the two above equations, the variable p would range from 0 at the beginning of each frame to ($N_w$–1) during the last sample for each frame. Note that if frames overlap, more than one instance of $R_j$ and $p_{j1}$ may exist at a given time. In these cases, each would be assigned to a frame and collect data for samples within the time period spanned by its assigned frame.

In other embodiments, a more generalized version of a least squares fit may be generated using the above equations to include delay if the regression matrix of Eq. 2 is augmented to include forward (or backward) delayed versions for the output of the $j^{th}$ stage input data buffer $s_{kj}$. For example, if the first two forward delays are to be included, two additional buffers (or vectors) $s_{(k-1)j}$ and $s_{(k-2)j}$ may be formed at the completion of each frame. These may be formed similar to the buffer (or vector) $s_{kj}$, except that rather than collecting the most recent $N_w$ samples (as for $s_{kj}$), the most recent $N_w$ samples are collected from the output of a one or two sample delay, respectively, being applied to the signal $s_j(k)$ (not shown in the figures). For example, in general if h sample periods of delay are present $$s_{(k-h)j}=[s_j(k-h)s_j(k-h-1) \ldots s_j(k-h-(N_w-1))]^T \quad (22)$$

The two forward delay terms may be combined with the gain, DC offset and slope terms to produce a ($N_w \times 5$) data regression matrix $X_j$ with the form $$X_j=[S_{kj}s_{(k-1)j}s_{(k-2)j}br] \quad (23)$$

Equation 23 (where $N_s$=5) may be compared to Eq. 2 (where $N_s$=3) or to Eq. 14 (where $N_s$=2). In order to support the modeling of both backward and forward delays, the cross correlation vector may also be formulated to include delay. For example, Eq. 5 may be calculated using the adjusted formula where a single delay is added to the target input buffer (in the case of Eq. 24 below, the first stage input buffer 191).

$$P_{j1}=X_j^T s_{(k-1)1} \quad (24)$$

In this case, applying Eq. 23 would result in the modelling of one forward and one backward delay.

Applying the results of Eq. 23 and Eq. 24 back into Eq. 4 and Eq. 6, the solution for $c_{1j}$ will produce a (5×1) vector of coefficients. Using these results in evaluating Eq. 7 will yield a translated input data buffer that may include adjustment with respect to time (or phase differences between the two input data buffers) in addition to DC offset, gain and slope. In general, any number of forward and backward delays may be modeled using this approach described in this disclosure for adjustment in a frame-by-frame basis. The delay in the cross-correlation formula of Eq. 24 is preferably set to ½ the maximum delay used by any column of the regression matrix if a balance between forward and backward delay levels is desired. However, it should also be noted that in general, if a good match in delay (or phase of the transfer functions) is present between the various input stages (in both the analog hardware and ADC's), the application of forward and backward delay modeling may not be required.

Even more generalized versions of this algorithm (with the corresponding value for $N_s$) may include an arbitrary mix of higher order terms (data values raised to an integer power), nonlinear functions or additional filters or linear transfer functions applied to regressor data to further improve the matching for the translation process in the presence of unknown delays (or phase) or nonlinearity between stages. Once the appropriate regression matrix (containing the terms to be modeled) is established, the same general method for determining the $N_s$ coefficients and parameters from hardware or software implementing Eq. 6 using the appropriate inputs for $X_j$ and $p_{j1}$ may be applied.

The matrix inverse in the solution for the coefficients of Eq. 6 depends on the determinant for the data auto-correlation matrix $R_j$. In cases where the analog input signal 105 contains only very low frequency information or is substantially close to zero, there may be times when the data auto-correlation matrix is singular or near singular. In these instances, coefficients and parameters from the previous frame may be used. Alternatively, coefficients and parameters may be re-calculated using a smaller value for $N_c$ obtained by selective removal of some of the columns in $X_j$ (such as delay terms). In the case where only gain and DC offset are being computed and $R_j$, and remains singular with $N_c$ set to 2, the following formulation is be useful:

set $\alpha_{12}$=prior known or measured gain $$\beta_{1j}=(p_{j1(1)}-R_{j(12)}\alpha_{1j})/R_{j(11)} \quad (25)$$

Where $R_{j(11)}$ represents the upper-left element from the matrix $R_j$ and $R_{j(12)}$ refers to the element directly to the right of it and $p_{j1(1)}$ represent the first element from the vector $p_{j1}$. Monitoring the determinant of the matrix $R_j$ allows for identifying instances when it becomes ill-conditioned or singular.

Figure 4:
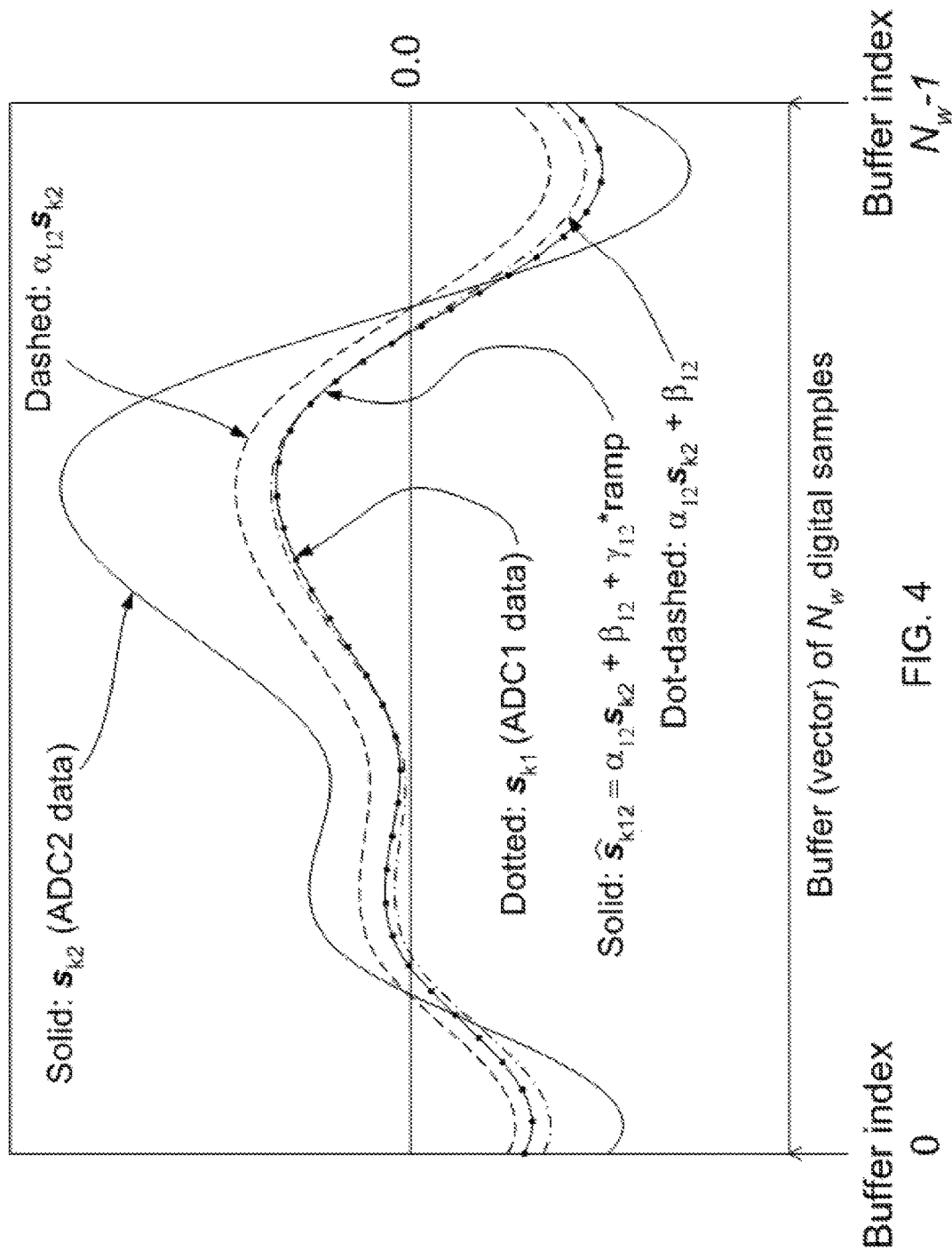
FIG. 4 illustrates the effects of applying scaling, offset and rotation for least-squares matching of a buffer of high-gain data to a buffer of low-gain data in an exemplary embodiment of the invention.

Referring to FIG. 4, the effect that various stages of the translation process have as they are applied to the data (or the waveform vector) of an input data buffer are graphically illustrated. While FIG. 4 is an example in reference to the translation process 402, similar steps and results are preferably present in other translators. Consider a second stage input data buffer 192 filled with data as represented by solid line waveform labeled as "$s_{k2}$ (ADC2 data)". The scaling function 432 of FIG. 2 scales the data as shown by a gain $\alpha_{12}$ 502a (in this case, roughly –6 dB) that may represent the difference in gain between the first and second analog stages. Following this multiplication, data represented by the dashed line results labeled as "$\alpha_{12}s_{k2}$" in FIG. 4. Next a DC offset operation 422 adds a DC constant $\beta_{12}$ 502b to shift data to the values as indicated by the dot-dashed line labeled as "$\alpha_{12}s_{k2}+\beta_{12}$" in FIG. 4. Finally, a slope adjustment operation 412 based on the coefficient $\gamma_{12}$ 502c rotates or skews data to values as indicated by the solid line (labeled as "$\alpha_{12}s_{k2}+\beta_{12}+\gamma_{12}$*ramp" in FIG. 4). At this point, data in the input data buffer 192 from the second stage has been scaled, DC offset and slope-adjusted by translation process 402 to closely match data from input data buffer 191 from the first stage represented by the heavy dotted line labeled as $s_{k2}$ (ADC1 data)". Following the translation, the resultant data 182 (also referred to as $\hat{s}_{k12}$) may be considered as averaging through or curve-fitting the noisier data contained in the input data buffer from the first stage 191.

The auto-correlation matrix $R_j$ and cross-correlation vector $p_{j1}$ of the previous equations have been based upon stored data that was collected during or referred to by the most recent frame (or spanning $N_w$ samples of data). However, in some embodiments, auto-correlation and cross-correlation matrices that cover a larger time-span may be desired. In these cases, a delay buffer of intermediary auto-correlation and cross-correlation matrices may be constructed. In cases where data from each frame overlaps (due to the window function design) its neighbor by ½ of the data, it may be preferable and more efficient to construct intermediary auto-correlation and cross-correlation matrices based on the data obtained during the last ½ of each frame (or spanning $N_w/2$ samples of data). For example, if the intermediary auto-correlation and cross-correlation matrices most recently completed based on the most recent (or the $q^{th}$) frame are referred to as $R_j^q$ and $p_{j1}^q$, these results may be stored for late retrieval. The longer-term auto-correlation and cross-correlation matrices may then be computed from the most recent $N_Q$ intermediary results according to $$R_j = \sum_{p=q}^{q-N_Q+1} R_j^p \qquad (26)$$

$$p_{j1} = \sum_{p=q}^{q-N_Q+1} p_{j1}^p \qquad (27)$$

In the special case where frames overlap by ½ and $N_Q=2$, Eq. 4 and Eq. 5 yield results equivalent to Eq. 26 and Eq. 27.

Continuing with the flow-chart of FIG. 3, following determination of translation coefficients between two stages at operation 362, an accuracy of fit parameter $\epsilon_{12}$ 342 generated at operation 372 provides an estimate of the sum of squares for the difference between the input data buffer 1 output 191 and the result 182 obtained by translating (fitting) the output of input data buffer 2 192 to input data buffer 1 output 191.

When translating data from the $j^{th}$ stage to match data from the first stage, an accuracy of fit parameter may be expressed as $$\epsilon_{1j} = e_{1j}^T e_{1j}$$

Where $$e_{1j} = (\hat{s}_{k1j} - s_{k1})$$

So it may be calculated using $$\varepsilon_{1j} = \sum_{n=0}^{N_w-1} (\hat{s}_{1j}(k-n) - s_1(k-n))^2 \qquad (28)$$

For example, if the regression matrix from Eq. 2 and Eq. 3 is used, this may be expanded as $$= \sum_{n=0}^{N_w-1} \left(\left(\alpha_{1j}s_j(k-n) + \beta_{1j} + \frac{\gamma_{1j}n}{(N_w-1)}\right) - s_1(k-n)\right)^2 \qquad (29)$$

An alternative simpler formulation that is generally applicable for any specified regression matrix may be derived as $$\epsilon_{1j} = c_{1j}^T R_j c_{1j} - 2c_{1j}^T p_{j1} + s_{k1}^T s_{k1} \qquad (30)$$

For example, an efficient calculation for the accuracy of fit parameter $\epsilon_{12}$ 342 in the system 100B of FIG. 2 may be obtained for a given frame by evaluating Eq. 30 after setting the subscript j=2 and using the autocorrelation and cross-correlation inputs used for calculating $c_{12}$ during that frame. In the two stage system 100B of FIG. 2, a fitting accuracy requirement of $\epsilon_{12}<T_f$ serves in making a decision to set the window-packet selector index 206 $m^q=2$ to cause packet selector 201 use ADC2 window-packets 172, rather than those 171 from ADC1. The value for $T_f$ may typically range from $(10^{-7}*N_w)$ to $(10^{-12}*N_w)$, depending on the number of bits used in each ADC and desired accuracy in the fitting.

The alternative condition $\epsilon_{12} \geq T_f$ may be used to indicate that at least some of the translated data 182 used in forming ADC2 window-packets 172 was derived from corrupt data from the second stage input buffer 192. It's important to recognize that even though very slight clipping events will trigger the selection of ADC1 data; so will any other condition that would render the use of a packet derived from a high gain stage disadvantageous. It's also important to note this method does not constitute using a clipping related threshold, but rather an accuracy of fit determining suitability for the window-packet associated with the translated buffer to be used in waveform repair. This provides a substantial advantage over the prior-art in detecting any reason for a lack of fit including detecting those where the required accuracy of fit that may approach the bit level. Important reasons besides clipping for rejecting packets (that while perhaps small, are meaningful at the bit-level) from higher gain stages may include slight nonlinearities in the ADC's or analog hardware, transient artifacts from filters that may linger, malfunctioning or inadequate ADC accuracy, any form of distortion, delay or misalignment caused by dissimilar or drifting transfer functions, or other noise artifacts. It is also important to note that in many cases, the decision as to which window-packet to use may involve a complex coupling between the reasons stated above and input signal characteristics, even in many cases when no clipping or large amplitude signals are present. Using an accuracy of fit criteria as defined here provides a simplified and reliable means for deciding which window-packet is best suited for selection during each frame.

While the sum of squared errors may be used for the accuracy of fit criterion, additional methods are envisioned within the scope of this invention. For example, if the difference between the first stage input data buffer output 191 and the result 182 obtained by translating (fitting) the output of second stage input data buffer 192 to it is to be compared, a sum of the absolute values defined by $$\varepsilon_{1j} = \sum_{n=0}^{N_w-1} |\hat{s}_{1j}(k-n) - s_1(k-n)| \qquad (31)$$

may also be applied. Yet other envisioned methods would involve determining the maximum of the squared or absolute values in the difference between the translated and target buffers.

In cases where more than two stages are used, more than one accuracy of fit parameter may be presented to the selector index generator 207. For example, in the three-stage example of FIG. 1, selector index generator 207 for setting the packet selector index $m^q$ 206 has two accuracy of fit parameters: $\epsilon_{12}$ 342 from data fitting operation 302 and $\epsilon_{13}$ 343 from data fitting operation 303. Generally, if a sufficient level for accuracy-of-fit is achieved for a series of stages having different gains, the output from the ADC having the highest gain stage will provide the lowest level of quantization noise. In this case, the index generator 207 first tests if the accuracy condition $\epsilon_{13}<T_f$ is met and if it is, set $m^q=3$ to cause selector 201 to select input window-packets from the third (and highest gain) stage 173. In the event that $\epsilon_{13} \geq T_f$, the selector index generator 207 subsequently tests if the condition $\epsilon_{12}<T_f$ is met and if it is, set $m^q=2$ to cause selector 201 to select window-packets from the second (mid-gain gain) stage 172. Finally, if neither accuracy-of-fit parameter meets the accuracy condition, the selector index generator 207 sets $m^q=1$ to cause selector 201 to select window-packets 171 from the first (lowest gain) stage. In general, the strategy employed by the selector 201 will be to select window-packets corresponding to the highest gain stage that has its corresponding accuracy of fit parameter satisfying the accuracy of fit requirement, $\epsilon_{1j} < T_f$.

While operations are shown in FIG. 3 as sequential operations (and indeed may be processed as shown), the coefficients are simultaneously computed by solving the matrix equation. This has an important advantage over the prior-art in that interdependencies between the three (or two or other number of) coefficients in $c_{1j}$ are automatically optimized for a minimum least-square error, determined by summing the squares of the differences between the translated input data buffer and stage one input data buffer containing ADC1 data 191.

Figure 5:
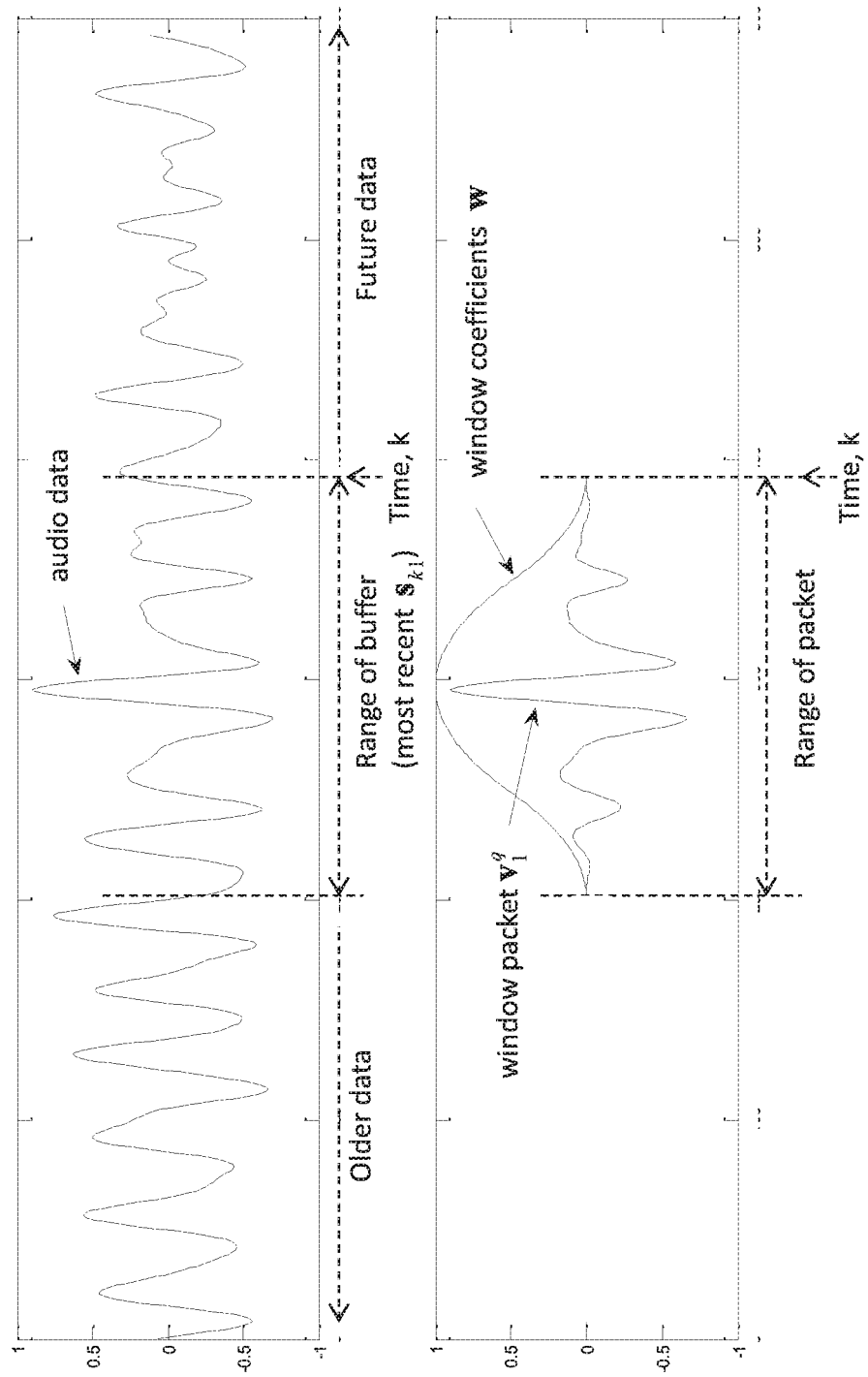
FIG. 5 is an illustrative depiction of how windowing may be applied to a frame of data representing an audio waveform for a single stage in accordance with at least some embodiments of the present invention.

FIG. 5 provides additional details regarding the operation of the input data buffer 131 and window function 161 for the first stage. For example, the time span referred to as "range of buffer" in the upper plot of FIG. 5 may be inferred as the portion of the ADC1 created digital input signal (or stream) 151 that is accumulated into the input data buffer 191 at discrete time index, k. The point labeled "Time, k" in FIG. 5 references the latest (possibly most recent available) sample collected by the buffer. At certain discrete time intervals dependent on buffer-length and overlap, the contents of the first stage input data buffer 191 are multiplied sample-per-sample by the corresponding coefficients from a desired window function. An example of this is shown in the lower plot of FIG. 5 and is labeled "window coefficients". In vector notation, we may express these coefficients in column-vector form as $$w = [w(0) w(1) w(2) \ldots w(N_w-1)]^T \quad (32)$$

Continuing with example of stage 1, these are the coefficients to be applied by a window function 161 to the first stage input data buffer 191 when creating the output window-packet 171. The window function 161 is applied on a sample-by-sample basis over the entire span of the first stage input data buffer 191 according to $$v_{k1}^q(n) = w(n) s_1(k-n), \text{ where } n=0,1,\ldots N_w-1 \quad (33)$$

where $v_{k1}^q(n)$ refers to the $n^{th}$ index of the window-packet vector that was created using data from the first stage at a discrete time index k that corresponds to the $q^{th}$ frame. In vector form, we may write the following expression noting this vector contains window-packet elements based on non-translated data from the first stage corresponding to a sample period ranging from k (the current sample index) to $k-(N_w-1)$.

$$v_1^q = w^T s_{k1} \quad (34)$$

where $$v_1^q = [v_{k1}^q(0) v_{k1}^q(1) v_{k1}^q(2) \ldots v_{k1}^q(N_w-1)]^T \quad (35)$$

FIG. 5 includes an illustration of a window-packet as labeled in the lower plot that would be created if the window coefficients were applied to the section of data labeled as "range of buffer" (referring to the first stage input data buffer in the case of the first stage or a translated buffer for other stages) in the upper plot. The resultant "window-packet" is shown in the lower plot.

For subsequent stages (j=2, 3 … $N_S$), data from the translated buffers (rather than input data buffers) are used in constructing window-packets.

$$v_{kj}^q(n) = w(n) \hat{s}_{1j}(k-n), \text{ where } n=0,1,\ldots N_w-1 \quad (36)$$

where $v_{kj}^q(n)$ refers to the $n^{th}$ index of the window-packet vector that was created using data from the $j^{th}$ stage at a discrete time index k that corresponds to the $q^{th}$ frame.

In vector form, we may again write the following expression noting this vector contains window-packet elements based on translated data from the $j^{th}$ stage corresponding to a sample period ranging from k (the current sample index) to $k-(N_w-1)$.

$$v_j^q = w^T \hat{s}_{k1j} \text{ for } (j=2,3 \ldots N_S) \quad (37)$$

where $$v_j^q = [v_{kj}^q(0) v_{kj}^q(1) v_{kj}^q(2) \ldots v_{kj}^q(N_w-1)]^T \quad (38)$$

Window-packets may be created at select values of k when packetizing is set to take place upon completing the acquisition for each frame of data and translation. They may be stored in addition to previous window-packets created during the last or previous frames to allow for construction of the output 104.

For example, assume at the most recent time index k, Eq. 37 was implemented due to the completed acquisition and subsequent processing of the $q^{th}$ frame. Then $v_j^q$ (at that time) refers to the most recently completed window-packet output for the $j^{th}$ stage, while $v_j^{q-1}$ refers to the window-packet previously calculated ($N_W/2$) sample periods ago and was based on translated data that now corresponds to (the older) sample periods ranging from $k-(N_W/2)$ to $k-(3N_W/2-1)$.

One sample period later, $v_1^q$ would still refer to the most recent window-packet. However its elements would then refer to first stage data corresponding to sample periods k−1 (since the current sample index k incremented by one) through $k-N_w$. Similarly, $v_{11}^{q-1}$ would now refer to first stage data corresponding to sample periods $k-(N_w/2)-1$ to $k-(3N_w/2)$. This would continue during each successive sample period until when reaching one sample prior to the complete acquisition for the next frame when elements of $v_1^q$ would refer to data corresponding to sample periods $k-(N_w/2)+1$ through $k-(3N_w/2)+2$. Similarly, $v_1^{q-1}$ would now refer to first stage data corresponding to sample periods ranging from $k-N_w+1$ to $k-2N_w+2$). Upon the next sample period (when the next frame acquisition is complete), the value for q would be indexed by one and a new window-packet will be computed and assigned the label $v_1^q$. The previous window-packet (that was previously referred to as $v_1^q$) would now be assigned to index q−1 and be referred to as $v_1^{q-1}$. The oldest window-packet (that was previously referred to as $v_1^{q-1}$) may be discarded if each window function only overlaps with ½ of its neighbor and any output data relying on it has been constructed. At this point, each of the two window-packets could again refer to data corresponding to sample points having indexes as described in the previous paragraph (indexes k to $k-(N_w-1)$ for the new $v_1^q$ and indexes $k-(N_w/2)$ to $k-(3N_w/2-1)$ for the new $v_1^{q-1}$), although with index k also continuing to index to the latest data. This process may be considered as continuing as the system continues to receive newer data.

Since the quantization noise level for data 182 supplied to window function 162 is less than that for the output data 191 supplied to window function 161, window-packets 172 formed in the second stage may be considered similar to window-packets formed in the first stage 171, with the exception that quantization noise in window-packets for the second stage 172 is lower than compared with window-packets for the first stage 171 (provided that data in the second stage is not corrupted). Along these same lines, if the three stage system of FIG. 1 is used, window-packets 173 associated with the (highest gain) third stage will have lower quantization noise then for either window-packets associated with the other two stages 172 or 171 (provided that data in the third stage is not corrupted).

Figure 6:
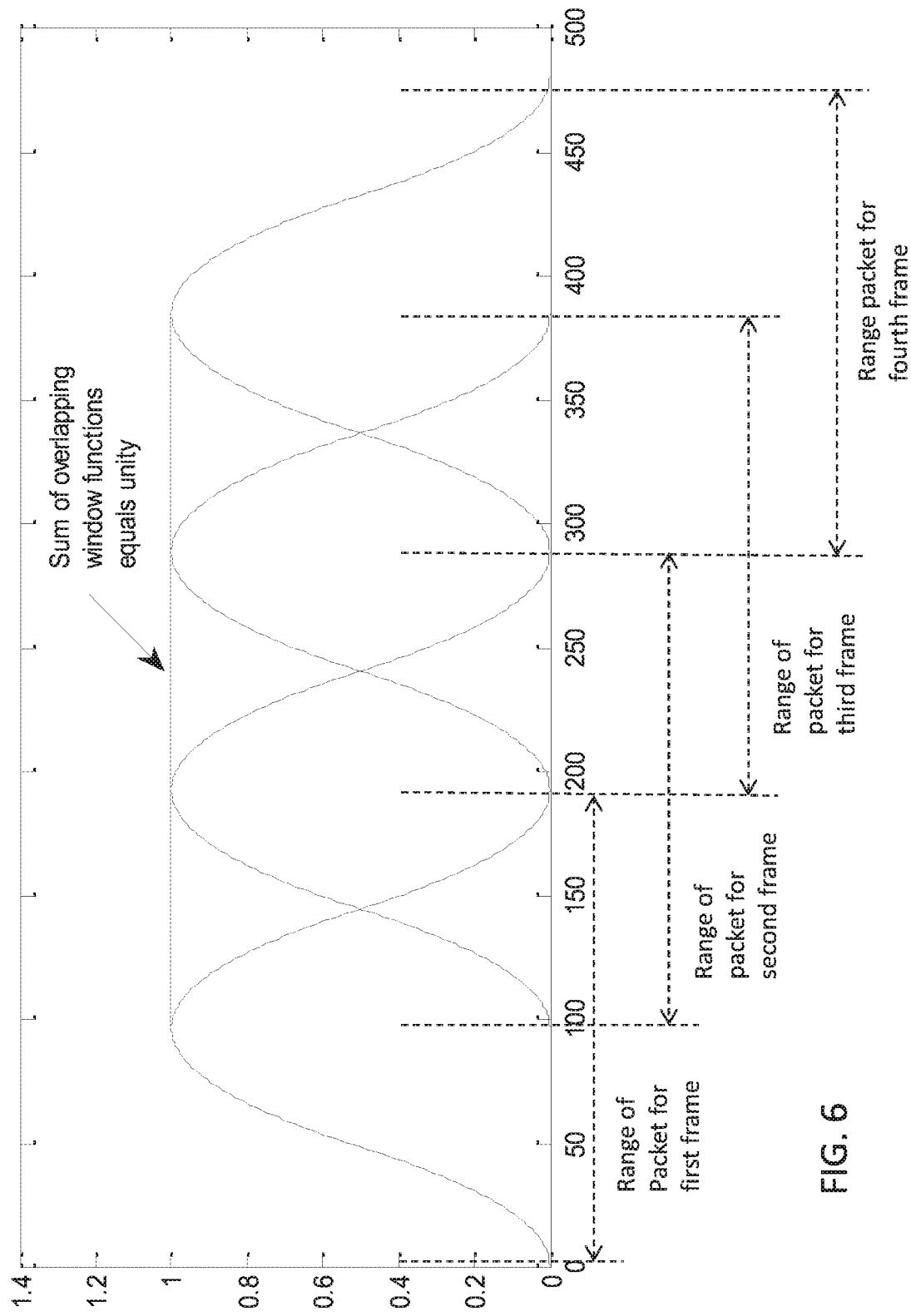
FIG. 6 is an illustrative depiction of how the application of window functions to regions of data corresponding to overlapping frames may be additive to a unity gain for a given stage in accordance with at least some embodiments of the present invention.

FIG. 6 illustrates a relationship between adjacent window functions (and frames) that is helpful in understanding the exemplary embodiments. In FIG. 6, an example location for four sequential windows (that will be applied in creating respective window-packets) are plotted where each window has a length of $N_W$=192 samples. Since the amount of overlap in this example corresponds to ½ of the window length, the application of each window during each frame occurs at intervals of $N_W/2$=96 samples. In other words, the above equations may be applied during each frame for translating (or fitting) the output data from input data buffers at intervals when the discrete time index k=0, 96, 192, 288, 384 . . . (or when correspondingly, q=0, 1, 2, 3, 4 . . . ) and continuing at the frame rate corresponding to integer multiples of 96 sample periods for this example. FIG. 6 further illustrates the corresponding range in time that each packet would have and we note these overlap by ½ on either side and are spaced by $N_W/2$=96 samples. While numerous window functions may be applied (triangular, smooth, etc.), the overlap does not, in general, need to occupy ½ of the window length. For example, rectangular windows would remove the presence of any overlap. Furthermore, although symmetric windows are illustrated for this example, symmetry is not generally required, as the shape of the window corresponding to overlap may change or be adjusted with the transition to each succeeding window.

An important property of the window function design is that the window functions when placed (or spaced) in time corresponding to the frame instances yields a constant summed value that is set to unity. This is illustrated in FIG. 6 where again the window length was (for purposes of illustration) set to $N_W$=192 and the overlap between adjacent windows was set to ½ the window length for the processing of a new frame every 96 samples. Assuming the property is established where the subsequent addition of window functions yields unity, the addition for the corresponding window-packets from a given stage would provide a blended signal similar to that which would be obtained if data were streamed from the buffer feeding that window function. As a further example, if in the example system 100B of FIG. 2, the window-packet from the first stage is always selected, the resultant streamed output 104 will correspond to a delayed (due to frame processing) version for the first stage input signal 151. Alternatively, if the second stage window-packets are continuously selected, the output 104 will provide a digital signal that is fitted (depending on the accuracy-of-fit parameter) to the first stage input signal frame-by-frame basis with blending between changes that take place in each independent fitting calculation.

For example, the following symmetric window function that is based on a quadratic function may be used:

$$w(n) = \begin{cases} 2(n/(N_w/2))^2 & \text{for} \quad 0 \le n \le \frac{N_w}{4} \\ 1 - 2((N_w/2 - n)/(N_w/2))^2 & \text{for} \quad \frac{N_w}{4} < n \le \frac{N_w}{2} \\ w(N_w - n) & \text{for} \quad \frac{N_w}{2} < n \le (N_w - 1) \end{cases} \quad (39)$$

Numerous other functions may also be suitable and may include those derived from trigonometric functions or constructed based on linear segments. Note that in this example the sum where $0 \le l < N_w/2$ $$w(N_w - 1 - l) + w\left(\frac{N_w}{2} - 1 - l\right) = 1 \quad (40)$$

Figure 7:
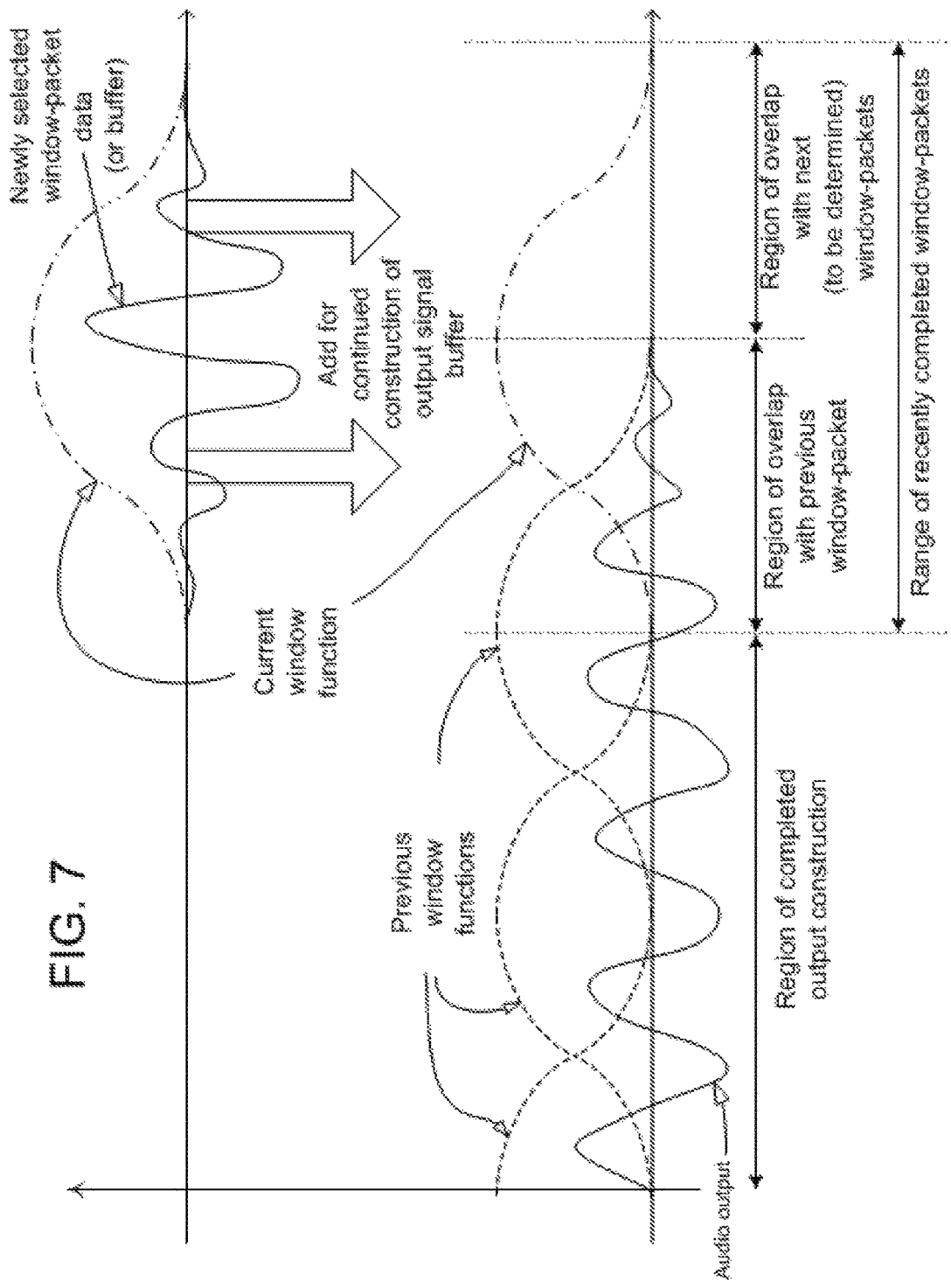
FIG. 7 is an illustrative depiction of how selected window-packets may be added in construction of an output buffer and/or output signal.

FIG. 7 illustrates accumulation of window-packets into the output data buffer 203. Window-packets selected by the selector 201 (FIG. 2) are aligned and added in the overlapping window section in the output construction process 202. Here, at intervals of $N_W/2$ samples, the selected window-packet 204 may be added into the output buffer 203. During each sample time, k, a new output sample may be shifted out of the buffer in producing the output stream 104, $s_{out}(k)$. Each output sample is constructed by adding contributions from any selected window-packets that have overlap with the present output sample. Since data for the most recent window-packet is not available until its input data is available and the computation of this data requires acquisition (and for some stages, translation to match first stage data), the input to output latency of the system in order to provide a constant stream (one output sample per sample period) will be at least $N_W-1$ samples. Output samples comprising the digital output stream 104 may be taken from a buffer of data constructed from the most recently and previously selected window-packets, as illustrated in FIG. 7. As shown, once the most recently selected packet is merged with an offset version for the previously selected packet (see region of overlap with previous window-packet in FIG. 7), a new section containing $N_W/2$ samples of output data in this overlap region becomes available for output streaming. The output streamer 205 of FIG. 2 would then sequentially select and output one sample per sample period until the $N_W/2$ samples in the overlap region has been exhausted. However, at this time (since $N_W/2$ sample periods have since elapsed), the next selected window-packet will become available for construction of another set of $N_W/2$ output sample (that now reside in the next region of overlap). Circular buffer memory management may be used to reuse memory locations in the processor for new overlap sections of data, once their previous results have been sent out by the output streaming unit 205.

As an alternative, in some embodiments, it may be preferable to calculate each output sample 104 based on direct access to the window-packet buffers (171 and 172 in FIG. 2). In these embodiments, the selector, rather than selecting window-packets, would output a window selector index that is set in dependence on the accuracy of fit parameters that are updated each frame. For example, assume that at some time labeled $k_q$ (e.g. taken from the collection of discrete time values, k=0, 96, 192, 288, 384 . . . mentioned above when a increments), new frames of input data just became available and each window overlaps with ½ of each neighboring window. The most recently received sample completing the input data buffers just made possible the construction for a new set of window-packets, and based on the time alignment of these packets, the output may be written as $$s_{out}(k_q) = v_{km^q}^q(N_w - 1) + v_{km^{q-1}}^{q-1}\left(\frac{N_w}{2} - 1\right) \quad (41)$$

In Eq. 41, the element corresponding to the oldest sample from $v_j^q$ is being added and the element near the center of the vector $v_j^{q-1}$ since the first half of $v_j^{q-1}$ was used during the prior frame.

After a fixed number of l samples later (where $0<l<N_w/2$), the current sample index is related to the sample index corresponding to the start of the frame by $k=k_q+l$, the above relation may be expressed as $$s_{out}(k_q+l) = v_{km^q}^q(N_w-1-l) + v_{km^{q-1}}^{q-1}\left(\frac{N_w}{2}-1-l\right) \quad (42)$$

As a further continuation of this example, if a two-stage system is used and during the previous frame, the selector index selected the first stage ($m^{q-1}=1$ for the window-packet based on ADC1 data) and for the current frame, the selector index selects the second stage ($m^q=2$ for the window-packet based on ADC2 data translated to fit data from the ADC1 buffer), the output may be written more specifically based on contents from the window-packet buffers 171 and 172 as $$s_{out}(k_q+l) = v_{k2}^q(N_w-1-l) + v_{k1}^{q-1}\left(\frac{N_w}{2}-1-l\right) \quad (43)$$

Furthermore, noting that since each frame occurs $N_w/2$ samples apart and overlaps by this amount and when referencing the most recent (rather than the previous frames) input data buffers in the expression, Eq. 33 may be rewritten for the previous $(q-1)^{th}$ frame as $$v_{k1}^{q-1}(n) = w(n)s_1\left(k-n-\frac{N_w}{2}\right) \quad (44)$$

Using Eq. 36 (with $j=2$ and $k=k_q$) along with these assumptions with respect to the range of data used on constructing each (current and previous) window-packets, Eq. 43 may be expanded as $$s_{out}(k_q+l) = w(N_w-1-l)\hat{s}_{12}(k_q-(N_w-1)+l) + \quad (45)$$
$$w\left(\frac{N_w}{2}-1-l\right)s_1(k_q-(N_w-1)+l)$$

For this example, Eq. 45 shows that the output may be expressed (or streamed as l ranges from 0 to $N_w/2-1$) in terms of elements taken directly from the first stage input data buffer 191 and second stage translated buffer 182.

This process continues until $l=N_w/2-1$ sample periods have elapsed since the first sample period of the frame when Eq. 45 becomes $$s_{out}\left(k_q+\frac{N_w}{2}-1\right) = w\left(\frac{N_w}{2}\right)\hat{s}_{12}\left(k_q-\frac{N_w}{2}\right) + w(0)s_1\left(k_q-\frac{N_w}{2}\right) \quad (46)$$

During the next sample, the next frame of data is available and window-packs for that frame are calculated with window-packets being referenced by frame index q and the previous window-packets now being referenced by q−1. If we again reset the sample reference $k_q$ to be the most recent sample from the current frame, the system of the previous three equations may be repeated for the creation of another $N_w/2$ samples of output data.

As a further example, if we assume the selector index continues to select the first stage ($m^{q-1}=1$ and $m^q=1$). Equation 45 may be written as $$s_{out}(k_q+1) = w(N_w-1-l)s_1(k_q-(N_w-1)+l) + \quad (47)$$
$$w\left(\frac{N_w}{2}-1-l\right)s_1(k_q-(N_w-1)+l) =$$
$$\left(w(N_w-1-l) + w\left(\frac{N_w}{2}-1-l\right)\right)s_1(k_q-(N_w-1)+l)$$

With the substitution $k_q=k-l$, it may be rewritten as $$s_{out}(k) = \left(w(N_w-1-l) + w\left(\frac{N_w}{2}-1-l\right)\right)s_1(k-(N_w-1)) \quad (48)$$

Where if the condition that overlapping window functions sum to unity as in the example from Eq. 40, we obtain $$s_{out}(k) = s_1(k-(N_w-1)) \quad (49)$$

And in this example, the output may be expressed as a delayed version for the digital output of the low-gain first-stage ADC1 output $s_1(k)$ 151. On the contrary, if the data is conditioned such that the selector index continues to select the second stage ($m^{q-1}=2$ and $m^q=2$), the output would not be represented by either a delayed version of exactly $s_2(k)$ or even a purely delayed version of $\hat{s}_{12}(k)$. Rather, it would represent the sum of each window-packet created from each frame of $\hat{s}_{12}(k)$ that was independently transitioned to match the corresponding ADC1 data (as described above), where the transitions between each frame is controlled by the shape for the edges of each window function.

Since packets corresponding to stages other than the first stage are translated to represent de-noised packets associated with the first stage and as long as any selected packet does not reference corrupted data, the resultant output stream will closely track the output that would have been produced by simply locking the selector to always select the first stage packet 171. However, an important change takes place when the selector 201 begins selecting packet 172 corresponding to the second or a higher gain stage. Due to the higher analog gain preceding its input, ADC2 112 or an ADC from a higher-gain stage is making greater use of its input range. Assuming all ADC's have the same number of bits (typically 24), the quantization error in the output for each stage will be identical. In each case, the input buffering functions 131, 132 and any additional higher-gain stages can be thought of as collecting the original input signal (with varying gain) and noise (having the same power level). However, in translating the second or a higher stage input data buffer to serve as a de-noised version of the first input data buffer 191, a gain of less than unity would result and is applied to the sum of signal plus noise in data contained in the input data buffer 192 of the second stage input data buffer or higher stage buffer. In scaling, while the signal levels are brought to match those in input data buffer 191 of the first stage, the quantization will also be attenuated by the difference in gain. Therefore, in time periods when the selector is able to select uncorrupted packets 172 from the second or higher stage, it is essentially repairing sections of data corresponding to the range of those packets using higher quality (lower noise) data that has been aligned to average through (or curve-fit)

the originally noisy data. During these times, the reconstructed output 104 will provide a digitized version of the analog input matching the first stage, but having lower quantization noise. For example, if the gain difference in a two-stage system is 30 dB, the quantization noise will be reduced by approximately 5 bits.

Furthermore, the sloped edges of the adjacent window functions provide for a smooth transition (or cross-fade) between stages to further mask any errors in the DC offset, gain or slope, or other sources of data mismatch that indeed may already be at the bit-level or lower when compared to data from the first stage.

There are times, however, when the system must select packets from the first stage. This may even be true whether or not data from the second stage is clipping. Ideally, with a perfectly linear-time-invariant system where the gain and offset were known precisely and no clipping existed on either ADC, one could model the differences or create an exact match between the high gain ADC2 outputs through the offset and scaling of it to match that of ADC1. This would of course have to include the addition of a noise term to account for the difference in quantization error between them. If we assumed further in this ideal environment that the digital input signal created by ADC2 intermittently clips, but that these clipping intervals had no effect on any output samples adjacent or near to them (when the analog signal was not clipping), a simple algorithm (see prior-art) could simply select or directly cross-fade between samples from ADC1 during ADC2 clipping events and from a scaled and shifted ADC2 otherwise. This would minimize the quantization noise levels in the output (always modeling the gain and offset of ADC1) along with preserving the dynamic-range in utilizing the non-clipping ADC1 (with higher quantization noise) output only when required.

However, in practice, the gain and/or DC misalignment is occurring for a collection of reasons too numerous, complex and/or time-varying to quantify. Practical measurements indicate that these misalignments are time-varying and non-linear, and vary depending on the frequency content of the signal. This prevents any stationary description of the relationships required to match ADC output data from differing stages. They can, however, be modeled over relatively short periods of time, typically measured in milliseconds. This invention utilizes these characteristics by decomposing the two signals into a set of windowed-packets for both the high and low-gain ADC's, where the continuous addition of window-packets for either ADC retrieves information originating from the original ADC output. The time-varying nature of fitting each individual packet gives the system 100A or 100B the unique ability to repair based on tracking non-stationary gains, offsets, changes in linearity, noise characteristics, delay and transfer functions and only doing so when the repair is advantageous. This overcomes limitations in the prior art where monitoring high gain signals for clipping or the simple application of timers following clipping events does not provide a reliable indicator for the suitability of using that data.

Figure 8:
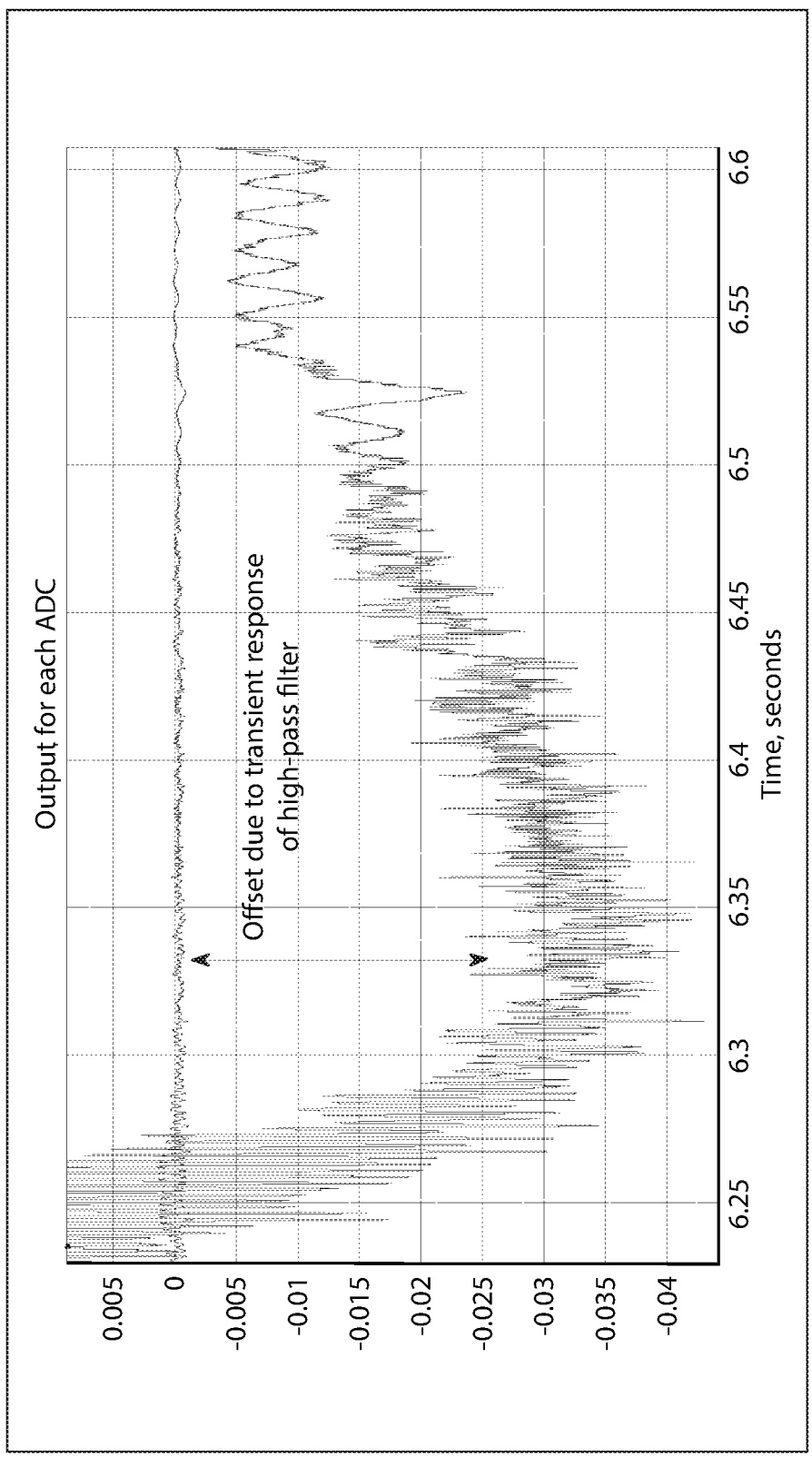
FIG. 8 contains a plot of data for high and low-gain stages illustrating extended offset due to transient response of a high-pass filter.

Another advantage of the described invention is exceptionally fast and reliable tracking of very slight changes in gain difference (with or without delay), DC offset and possibly slope. Consider the data plots shown in FIG. 8. FIG. 8 shows a portion of data for the output of two ADC's having a gain difference of approximately 25 dB. Just prior to the occurrence for the section of data shown, a clipping event took place in the second stage. The difference between the waveforms is initially quite large due to the transient recovery of the input filters. While most of the higher frequency information is still in good alignment between the two stages, a simple algorithm based on observing the magnitude for either signal or a timer compared to a threshold will fail to determine at what point the information becomes useful.

In cases where the accuracy of fit for the highest gain analog stage remains within tolerance extended periods of time, it may be preferable to intermittently switch or transition off dynamics of the translation process while holding the selector 201 to select the highest gain stage. In this mode, the output signal simply becomes a scaled and offset version of the highest gain ADC output $S_{N_S}(k)$ (referring to the digital input signal created by ADC2 152 when two stages are used or the digital input signal created by ADC3 153 when three stages are used).

Figure 9:
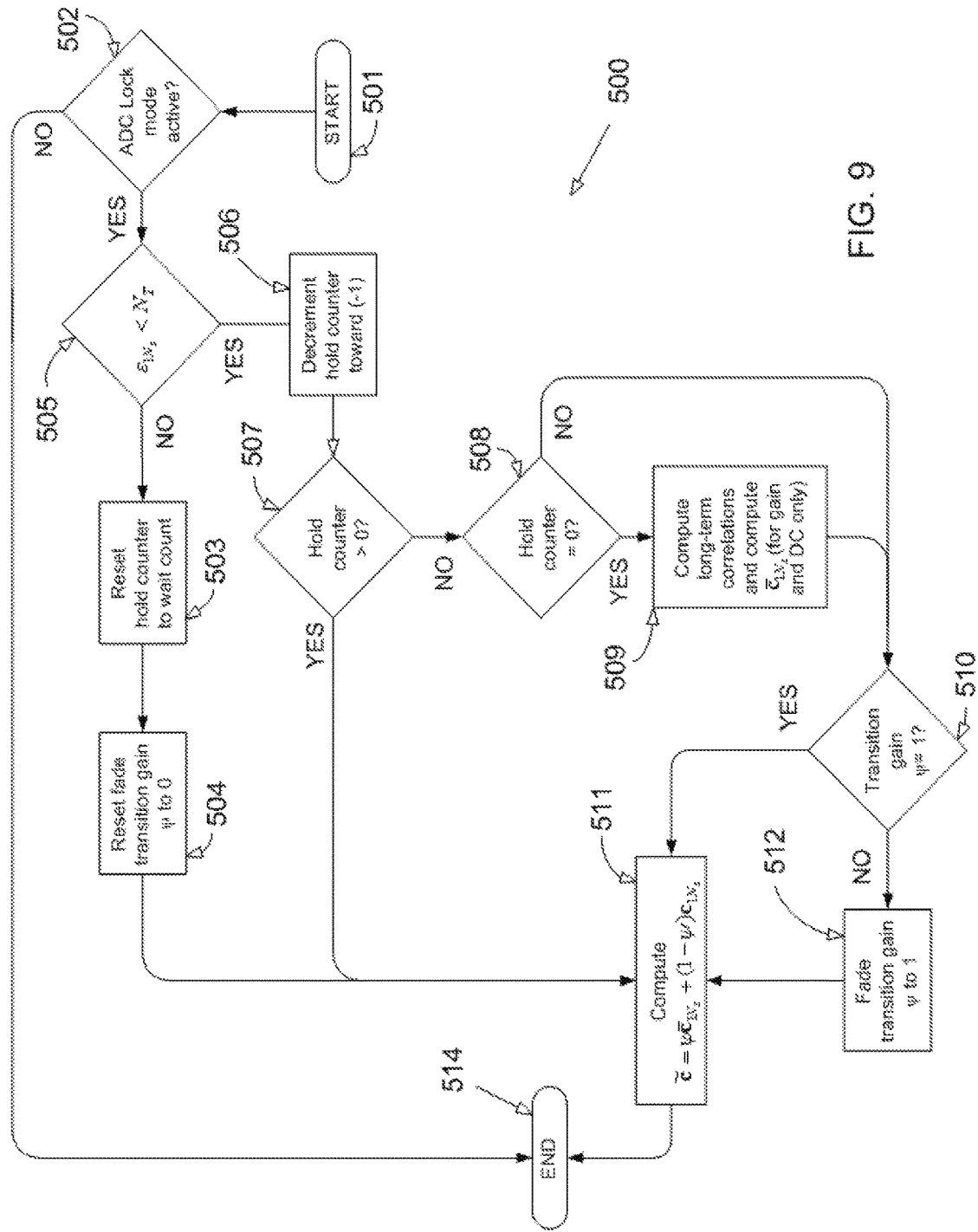
FIG. 9 is an illustrative flowchart outlining an optional ADC lock feature that can be implemented with the array based ADC systems of FIG. 1 or 2.

Turning now to FIG. 9, an illustrative flowchart 500 outlining operations of performing lock-hold operations is shown. The lock-hold feature is optional. After starting at operation 501, an ADC lock active mode flag 502 is checked to determine whether the lock mode is active. If the lock mode is inactive, the process ends at an operation 514 from which the remaining parts of the system 100A or 100B continues operating as previously described. If the ADC lock mode 502 is active, the accuracy-of-fit parameter $\epsilon_{1N_S}$ (referring, e.g., to $\epsilon_{12}$ 342 in FIG. 2) for the highest gain stage is checked against the accuracy requirement $T_f$ at operation 505. If the criterion is not met, the process resets the optional hold wait count to a programmed reset value at operation 503 and fade transition gain $\psi$ to zero at operation 504. The programmed reset value for the hold wait count 503 may typically be set in the range of 0 ms (when not used) to 700 ms and may constitute a tuning variable with the optimal value depending on the accuracy (for analog components) and characteristics of the analog hardware preceding the ADC's. Following the reset of the fade transition gain 504, the process proceeds to operation 511.

If the accuracy criterion at operation 505 is met, the process decrements the hold counter at operation 506 toward minus one. Proceeding to operation 507, the hold counter is tested for a value greater than zero. If the hold-counter value is greater than zero, the process proceeds to operation 511. Otherwise, the hold counter is tested for a value of zero at operation 508. If the hold-counter is not equal to zero (value of minus one), the process proceeds to operation 510. Otherwise, the process proceeds to operation 509 where the auto-correlation matrix $R_{N_S}$ and cross-correlation vector $p_{N_S 1}$ may be retrieved from collected data as described earlier relating the first and highest gain stages, but with any slope terms omitted. These may be accumulated over previous frames where the accuracy of fit criteria is satisfied and are used to compute a long-term translation coefficient vector $\bar{c}_{1N_S}$ based on a least-squares fit (e.g. Eq. 6 with $j=N_s$). Alternatively, a prior coefficient vector or an average of prior coefficient vectors may be used as a setting for $\bar{c}_{1N_S}$. In a preferred embodiment, the time period for the collection with this feature may be longer than that used between each translation processes 182 or 183. Note that time periods for data collection would coincide with previous frames where accuracy-of-fit condition for the highest gain stage was met.

The process continues to operation 510 where a transition gain $\psi$ is compared with the gain of unity. If it has reached a gain of unity, the process continues to operation 511. Otherwise, a fading operation at operation 512 will increase the gain $\psi$ toward a value of unity. In some embodiments, the process of increasing the gain $\psi$ may either be exponential tracking or linear ramping. The process then continues at operation 511 where a faded set of translation coefficients for the stage is computed according to:

$$\tilde{c}_{1N_S} = \psi \bar{c}_{1N_S} + (1-\psi) c_{1N_S} \quad (50)$$

The vector $\bar{c}_{1N_S}$ may be augmented with zero values for any coefficients present in $c_{1N_S}$, but that are not being modeled here (such as slope). The process subsequently ends at operation 514. In the event that operation 511 was executed, the system 100 then proceeds to use the newly created translation coefficients in $\tilde{c}_{1N_S}$ in place of the most recently calculated coefficients in $c_{1N_S}$ in the highest gain (or last) stage computation of $\hat{s}_{k1N_S}$. The remainder of the algorithm functions as describe earlier.

Illustrative embodiments of the invention described herein have described fitting data from each stage following the first stage (operations 302 and 303 from FIG. 1) to the first stage (referring to the lowest gain stage). Other embodiments of the invention use a cascading approach where data is sequentially fit from one stage to the next, progressing to the lowest gain stage. In general, as long as a pathway exists for subsequent fitting of data from each stage to the lowest gain stage, alternative configurations for this invention may remain operative.

While the lock-hold mode described earlier has focused on locking the output to the highest gain stage, other modes are envisioned where a lock-hold mode may be applied to stages other than the highest gain.

For example in a three stage system, a lock-hold may be applicable to both the highest gain (third) stage and for the middle gain (second) stage. If the accuracy of fit criteria is satisfied over an extended period of time for translation of data relating the second stage to the first ($\epsilon_{12}<T_f$), but the relation ($\epsilon_{13}<T_f$), does not consistently hold for translating third stage data to the first, a lock-hold may be applied to output data from the second stage, except during intermittent frames where when the accuracy of fit criteria is satisfied for data from the third stage translated to match data from the second stage ($\epsilon_{23}<T_f$), window-packets based on third stage data translated to match the locked second stage data may be selected.

This disclosure also describes operation performed on a basis of buffers (or collections or frames) of data. This was done to facilitate a clear understanding for the principals and operation of the invention. However, alternative embodiments include those where some operations may be implemented on a sample-by-sample basis, which in some cases may bypass the need for completely collecting full-sized buffers of data for simplicity or efficiency of the implementation.

In the exemplary embodiments described above, the translation operations were performed in data prior to packetization by the window function. However, performing translation operations after packetization is also possible and contemplated to be within the scope of the invention.

Other configurations and variants within the scope of this invention will be apparent to those skilled in the art.

What is claimed is:

1. A method of converting an analog input signal to a high fidelity digital output signal, comprising the steps of:
    transmitting an analog input signal from an analog signal source;
    providing the analog input signal in at least two stages having distinct levels of amplification;
    converting each resultant amplified analog input signal to a digital input signal for the respective stage, wherein the digital input signal for the respective stage comprises digital data samples;
    assigning the digital data samples for each stage to correspond to a frame in dependence on when they are received, wherein the time period of each frame is interchangeable between stages;
    applying a window function overlapping in time to each frame of data to create windowed data packets for each respective stage;
    providing the windowed data packets as inputs to a combiner;
    selecting a windowed data packet for one of the stages to be used by the combiner to generate the digital output signal.

2. The method according to claim 1 where each frame is stored in a buffer at a frame rate.

3. The method according to claim 2, wherein a frame of data in at least one buffer for one stage is translated to match a frame of data from another buffer for another stage prior to the application of the window function.

4. The method according to claim 3, wherein translation is performed utilizing least squares regression.

5. The method according to claim 4, wherein performance of least squares regression utilizes auto-correlation and cross-correlation statistics that are accumulated based on at least two digital data inputs over a finite time span equal to or greater than the span of each data buffer and applied during each frame.

6. The method according to claim 3, wherein translation includes adjusting at least one of in, DC offset, slope or delay.

7. The method according to claim 1, wherein the window function is constructed such that the addition of subsequent window data packets derived from a digital input signal for the same stage would substantially reproduce the original digital input signal for the stage.

8. The method according to claim 3, wherein the decision on which windowed data packets to select for a given frame is based at least in part on an accuracy of fit parameter created during the translation of one data buffer to match another.

9. The method according to claim 8 wherein the translation coefficients are locked to a predetermined value if the accuracy of fit parameter indicates a high degree of fit for an extended period of time between translated data and target data.

10. The method according to claim 7 wherein the accuracy of fit parameter is defined by the sum of squares for the difference between at least one buffer and at least one translated buffer.

11. The method according to claim 1, wherein the analog input signal for one stage has an amplification gain of zero dB.

12. The method according to claim 1, wherein the analog input signal for one stage has an amplification gain of 30 dB.

13. A method of converting an analog input signal to a high fidelity digital output signal, comprising the steps of:
    transmitting an analog input signal from an analog signal source;
    providing the analog input signal in at least two stages having distinct levels of amplification;
    converting each resultant amplified analog input signal to a digital input signal for a first stage and to digital input signal for a second stage, wherein the digital input signal for the respective stage comprises digital data samples;
    assigning the digital data samples for each stage to correspond to a frame in dependence on when they are received;
    translating a frame of data for the second stage to match a frame of data for the first stage;

providing the translated frame of data for the second stage and the frame of data for the first stage for use by a combiner to generate the digital output signal.

14. The method according to claim 13 further comprising the step of storing frames of data samples for each stage to a corresponding data buffer prior to the translating step.

15. The method according to claim 14, wherein translation is performed utilizing least squares regression.

16. The method according to claim 15, wherein performance of least squares regression utilizes auto-correlation and cross-correlation statistics collected between two digital data inputs over a time span equal to or greater than the span of each data buffer.

17. The method according to claim 13, wherein translation includes adjusting at least one of gain, DC offset, slope or delay.

18. A multi-stage analog-to-digital conversion system comprising:
- a first stage and second stage analog-to-digital converter, each having an analog input transmitted from a common analog input source and each outputting a digital input signal, wherein the amplification gain of the second stage analog-to-digital converter is greater than the amplification gain of the first stage analog-to-digital converter;
- a digital processor that receives the digital input signal from the first stage analog-to-digital converter and the digital input signal from the second stage analog-to-digital converter and outputs a constructed digital output signal, said digital signal processor providing:
- means for applying a window function that overlaps in time to the frames of digital input data for each stage to generate windowed data packets corresponding to each stage of analog input;
- and a combiner configured to select a windowed data packet for one of the stages and sequentially combine the selected data packets to construct the digital output signal.

19. The system of claim 18 further comprising data buffers for storing frames of digital input signal data for each stage.

20. The system of claim 19, wherein the digital processor further provides translation means for matching data from the data buffer for the second stage to the data buffer for the first stage prior to the application of the window function.

21. The system of claim 20, wherein the translation means includes the operations of at least one of scaling, adding a DC offset, adjusting a slope or delaying.

22. The system of claim 21, wherein the translation means operates on a basis of minimizing the sum of squares for the error between a data buffer and translated data buffer.

23. The system of claim 19, wherein the sum of sequential window functions is unity.

24. The system of claim 19, wherein the combiner is configured to select windowed data packets based at least in part on an accuracy of fit parameter.

25. The system of claim 24, wherein the accuracy of fit parameter incorporates a measure of the sum of least squares between at least one data buffer and at least one translated data buffer.

26. The system of claim 19 further comprising one or more additional stages and analog-to digital converters, wherein each data buffer other than that derived from the digital input signal created by the analog-to-digital converter having the lowest level of analog input amplification is translated to match the data buffer derived from the digital input signal created by the analog-to-digital converter having the lowest level of analog input amplification.

27. The system of claim 25, wherein the combiner selects window data packets that correspond to those derived from the digital input signal whose analog-to-digital converter has the highest level of input amplification in deriving its analog input signal and whose translated buffers are within a prescribed tolerance when compared to the data buffer derived from the digital input signal from the analog-to-digital converter having the lowest level of amplification.

28. The system of claim 23, wherein each data buffer other than that derived from the digital input signal from the analog-to-digital converter having the highest level of quantization noise is translated to match the data buffer derived from the digital input signal from the analog-to-digital converter having the lowest level of quantization.

29. The system according to claim 18, wherein the multi-stage analog-to-digital conversion system is part of an apparatus including a multi-track audio recorder and each digital output signal is provided as an input to the multi-track audio recorder.

30. The system according to claim 18, wherein the multi-stage analog-to-digital conversion system is part of an apparatus including a multi-track audio mixer and each digital output signal is provided as an input to a multi-track audio mixer.

31. The system according to claim 18 further comprising a wireless microphone apparatus, wherein the multi-stage analog-to-digital conversion system is part of said apparatus.

* * * * *